(12) United States Patent
Zimmerman et al.

(10) Patent No.: US 7,727,790 B2
(45) Date of Patent: Jun. 1, 2010

(54) METHOD FOR FABRICATING LIGHT EMITTING DIODES

(75) Inventors: Scott M. Zimmerman, Basking Ridge, NJ (US); Karl W. Beeson, Princetion, NJ (US); William R. Livesay, San Diego, CA (US); Richard L. Rose, Del Mar, CA (US)

(73) Assignee: Goldeneye, Inc., San Diego, CA (US)

( * ) Notice: Subject to any disclaimer, the term of this patent is extended or adjusted under 35 U.S.C. 154(b) by 69 days.

(21) Appl. No.: 12/011,816

(22) Filed: Jan. 29, 2008

(65) Prior Publication Data

US 2008/0182353 A1    Jul. 31, 2008

Related U.S. Application Data

(60) Provisional application No. 60/898,288, filed on Jan. 30, 2007.

(51) Int. Cl.
*H01L 21/66* (2006.01)

(52) U.S. Cl. .............................. 438/33; 438/22; 438/26; 438/34; 438/458; 438/481; 257/E21.121

(58) Field of Classification Search .................... 438/25, 438/33, 463
See application file for complete search history.

(56) References Cited

U.S. PATENT DOCUMENTS

| | | | |
|---|---|---|---|
| 6,071,795 A * | 6/2000 | Cheung et al. | ............... 438/458 |
| 6,559,075 B1 | 5/2003 | Kelly et al. | |
| 6,751,380 B1 * | 6/2004 | Imamura et al. | ............... 385/37 |
| 7,202,141 B2 | 4/2007 | Park et al. | |
| 7,241,667 B2 | 7/2007 | Park et al. | |

* cited by examiner

*Primary Examiner*—N Drew Richards
*Assistant Examiner*—Kyoung Lee
(74) *Attorney, Agent, or Firm*—William Propp, Esq

(57) ABSTRACT

The invention is method for fabricating light emitting diodes. A layered semiconductor structure is provided on a growth substrate. The method includes using a pulsed laser to form an interfacial layer between the layered semiconductor structure and the growth substrate for subsequent substrate detachment and to simultaneously form light extracting elements on the layered semiconductor structure. The method reduces the number of steps required to fabricate a light emitting diode.

12 Claims, 14 Drawing Sheets

PRIOR ART

US 7,727,790 B2

METHOD FOR FABRICATING LIGHT EMITTING DIODES

REFERENCE TO PRIOR APPLICATION

This application claims the benefit of U.S. Provisional Patent Application Ser. No. 60/898,288, filed on Jan. 30, 2007, which is herein incorporated by reference.

TECHNICAL FIELD

The present invention is related to the fields of semiconductor processing and light emitting diodes (LEDs). The invention is a method for separating a layered semiconductor structure from a growth substrate and simultaneously forming light extraction elements on the surface of the layered semiconductor structure. The invention can be utilized in the fabrication of light emitting diodes.

BACKGROUND OF THE INVENTION

Light emitting diodes can be fabricated by epitaxially growing multiple layers of semiconductors on a growth substrate. Inorganic light-emitting diodes can be fabricated from GaN-based semiconductor materials containing gallium nitride (GaN), aluminum nitride (AlN), aluminum gallium nitride (AlGaN), indium nitride (InN), indium gallium nitride (InGaN) and aluminum indium gallium nitride (AlInGaN). Other appropriate materials for LEDs include, for example, aluminum gallium indium phosphide (AlGaInP), gallium arsenide (GaAs), indium gallium arsenide (InGaAs), indium gallium arsenide phosphide (InGaAsP), diamond or zinc oxide (ZnO).

Especially important LEDs for this invention are GaN-based LEDs that emit light in the ultraviolet, blue, cyan and green regions of the optical spectrum. The growth substrate for GaN-based LEDs is typically sapphire ($Al_2O_3$), silicon carbide (SiC), bulk gallium nitride or bulk aluminum nitride.

Light emitting diodes generate a significant amount of heat during operation. The heat lowers the light output and operating lifetime of the LED. As LED chip sizes become larger, such heating effects become more important and can seriously degrade the light-output performance and lifetime of the LEDs.

Sapphire is a poor thermal conductor. If the GaN-based semiconductor structure is grown on sapphire, it is desirable to remove the semiconductor structure from the sapphire growth substrate and bond the semiconductor structure to a second substrate that has high thermal conductivity. Cheung et al. in U.S. Pat. No. 6,071,795 disclose a method for separating a thin film of GaN from a sapphire substrate. The method includes irradiating the interface between the GaN film and the substrate with light that is transmitted by the sapphire and strongly absorbed by the GaN film. At the interface, the irradiation causes the decomposition of GaN into gallium metal and gaseous nitrogen. An example irradiation source is a pulsed krypton fluoride (KrF) excimer laser operating at 248 nanometers. The laser beam is raster scanned across the sample. The 248 nm light is transmitted by the sapphire and strongly absorbed by GaN. Following irradiation, the exposed sample is heated above the melting point of gallium (30 degrees Celsius) and the substrate and GaN layer are separated. Any gallium residue remaining on the GaN layer after separation can be removed using, for example, a 50:50 volumetric mixture of hydrogen chloride (HCl) and water ($H_2O$). In order to handle the thin GaN layer and prevent the layer from breaking, the side of the GaN layer opposite the growth substrate can be bonded to a second substrate before the subsequent irradiation and separation steps. Cheung et al. do not disclose using a raster-scanned pulsed laser beam to separate the semiconductor layer from the substrate and to simultaneously form surface features that can be used as light extraction elements in LED devices fabricated from the semiconductor layer.

Kelly et al. in U.S. Pat. No. 6,559,075 disclose a method for separating two layers of material by exposing the interface between the two materials to electromagnetic radiation to induce decomposition of one of the materials at the interface. One of the layers can be a GaN-based semiconductor material and the other layer can be a substrate. An example electromagnetic radiation source is a pulsed, frequency-tripled, neodymium-doped yttrium-aluminum-garnet (Nd:YAG) laser operating at 355 nanometers. An example substrate is sapphire. The 355-nanometer light is transmitted by the sapphire substrate and absorbed by the GaN-based semiconductor material at the sapphire-GaN interface. The decomposition of GaN results in the formation of gallium metal and nitrogen gas.

Kelly et al. also discloses a process for lateral structuring the semiconductor material. One illustrated example discloses exposing the semiconductor material through a mask to form a lateral structure. Another illustrated example uses two coherent laser beams that interfere to form a lateral structure on the semiconductor material. Kelly et al. does not disclose using a raster-scanned pulsed laser beam to separate the semiconductor layer from the substrate and to simultaneously form surface features that can be used as light extraction elements in LED devices fabricated from the semiconductor layer.

Park et al. in U.S. Pat. Nos. 7,202,141 and 7,241,667 disclose a method for separating a layer of material such as GaN from a sapphire substrate. The method includes irradiating the interface between the GaN film and the substrate with laser light that is transmitted by the sapphire and strongly absorbed by the GaN film. An example laser is a pulsed krypton fluoride (KrF) excimer laser operating at 248 nanometers. In one optional method, the laser beam is formed into a line-shaped beam and the line-shaped beam is scanned across the sample. Park et al. do not disclose using a raster-scanned pulsed laser beam to separate the semiconductor layer from the substrate and to simultaneously form surface features that can be used as light extraction elements in LED devices fabricated from the semiconductor layer.

It would be desirable to develop a method to separate a layered semiconductor structure from a growth substrate and to simultaneously form surface features that can be used as light extraction elements in LED devices fabricated from the layered semiconductor structure. The combined process would eliminate the separate step of forming light extraction elements after the removal of the layered semiconductor structure from a growth substrate.

SUMMARY OF THE INVENTION

One embodiment of this invention is a method for detaching a layered semiconductor structure from a growth substrate and simultaneously forming surface features on the layered semiconductor structure. The method includes the steps of providing a layered semiconductor structure on a growth substrate, providing a pulsed laser beam and scanning the pulsed laser beam across the growth substrate in at least a first direction. The layered semiconductor structure has a first surface in contact with the growth substrate and a second surface opposite the first surface. The pulsed laser beam is transmitted by the growth substrate and absorbed by the layered semiconductor structure, decomposing the first surface of the layered semiconductor structure. As a result, an interfacial layer of non-uniform thickness is formed between the substrate and the layered semiconductor structure and surface features are simultaneously formed on the top surface of the layered semiconductor structure. The layered semiconductor structure is detached from the growth substrate by severing the interfacial layer.

In another embodiment of this invention, the pulsed laser beam is scanned across the growth substrate in both a first direction and a second direction before the layered semiconductor structure is detached from the growth substrate. The first scan direction decomposes a first portion of the first surface of the layered semiconductor structure and the second scan direction decomposes a second portion of the first surface of the layered semiconductor structure. The second direction is at an angle to the first direction. The first portion and second portion of the first surface of the layered semiconductor structure cover substantially all of the first surface.

Another embodiment of this invention is a method for fabricating a light emitting diode. The method includes the steps of providing a layered semiconductor structure on a growth substrate and providing a pulsed laser beam. The layered semiconductor structure has a first surface in contact with the growth substrate, a second surface opposite the first surface and includes a first doped layer, an active layer and a second doped layer. The pulsed laser beam is scanned across the growth substrate in at least a first direction. The pulsed laser beam is transmitted by the growth substrate and absorbed by the layered semiconductor structure, decomposing the first surface of the layered semiconductor structure. As a result, an interfacial layer of non-uniform thickness is formed between the substrate and the layered semiconductor structure and surface features are simultaneously formed on the first surface of the layered semiconductor structure. The layered semiconductor structure is detached from the growth substrate by severing the interfacial layer. The method for fabricating a light emitting diode further includes the step of fabricating a first electrode on the second surface of the layered semiconductor structure. In addition, a second electrode is fabricated on a first portion of the first surface of the layered semiconductor structure. When an electrical current is applied between the first electrode and the second electrode, the active layer emits light. The surface features improve light extraction from the light emitting diode.

In another embodiment of this invention, the layered semiconductor structure is preferably grown by hydride vapor phase epitaxy.

In another embodiment of this invention, a light emitting diode fabricated by the methods of this invention preferably reflects greater than 50% of externally incident light, more preferably greater than 60% of externally incident light and most preferably greater than 70% of externally incident light.

BRIEF DESCRIPTION OF THE DRAWINGS

A more detailed understanding of the present invention, as well as other objects and advantages thereof not enumerated herein, will become apparent upon consideration of the following detailed description and accompanying drawings, wherein.

DETAILED DESCRIPTION OF THE PREFERRED EMBODIMENTS

The preferred embodiments of the present invention will be better understood by those skilled in the art by reference to the above listed figures. The preferred embodiments of this invention illustrated in the figures are not intended to be exhaustive or to limit the invention to the precise form disclosed. The figures are chosen to describe or to best explain the principles of the invention and its applicable and practical use to thereby enable others skilled in the art to best utilize the invention.

Figure 1:
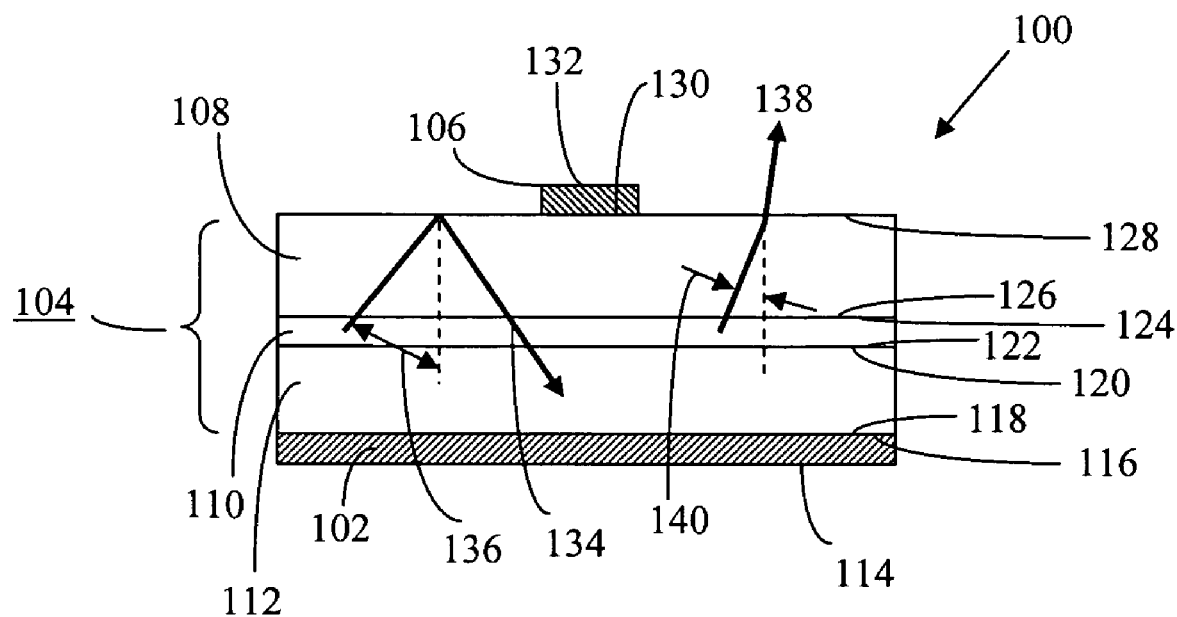
FIG. 1 is a side cross-sectional side view of a prior art light emitting diode.

An example of a prior art LED is illustrated in FIG. 1. FIG. 1 is a side cross-sectional view of prior art LED 100.

Prior art LED 100 includes a first electrode 102, a layered semiconductor structure 104 and a second electrode 106, which is on the opposite side of the layered semiconductor structure 104 from the first electrode 102. The layered semiconductor structure 104 includes a first doped layer 108, an active layer 110 and a second doped layer 112, which is on the opposite side of the active layer 110 from the first doped layer 108.

The first electrode 102 may be fabricated from a reflecting metal. For example, the first electrode 102 may be formed from one or more metals or metal alloys containing, for example, silver or aluminum. The second electrode 106 can be fabricated from gold or a gold alloy such as titanium-gold.

If LED 100 is a GaN-based LED, the layered semiconductor structure 104 can be fabricated from multiple layers of gallium nitride (GaN), aluminum nitride (AlN), aluminum gallium nitride (AlGaN), indium nitride (InN), indium gallium nitride (InGaN) and aluminum indium gallium nitride (AlInGaN).

The active layer 110 of the layered semiconductor structure 104 can be a p-n homojunction, a p-n heterojunction, a single quantum well or a multiple quantum well of the appropriate semiconductor material for the LED 100. For purposes of illustration, the active layer 110 of LED 100 is a multiple quantum well.

LED 100 is assumed for purposes of illustration to be a GaN-based LED. To briefly summarize the important fabrication steps for this GaN-based, illustrative example of a prior art LED, first a layered semiconductor structure 104 is fabricated on a growth substrate (not shown). A first electrode 102 is deposited onto the layered semiconductor structure opposite the growth substrate, followed by the attachment of a second substrate (not shown) to the first electrode. A liftoff process removes the growth substrate, exposing the surface 128 of the layered semiconductor structure that was originally attached to the growth substrate. Finally, a second electrode 106 is deposited and patterned on a portion of the exposed surface 128 of the layered semiconductor structure 104 opposite the first electrode 102.

The details of the structure and fabrication of the illustrative example LED 100 will now be described.

The first doped layer 108 is a n-doped GaN layer, which is epitaxially deposited or otherwise conventionally fabricated on a growth substrate (not shown). The n-doped GaN layer has a first or upper surface 128 and a second or lower surface 126, opposite the first surface 128. At this point in the process, the growth substrate (not shown) is attached to the upper surface 128 of the n-doped layer.

The active layer 110 is a GaN-based multiple quantum well, which is epitaxially deposited or otherwise conventionally fabricated on the first doped layer 108. The GaN-based multiple quantum well active layer 110 has a first or upper surface 124, deposited or fabricated on the second surface 126 of the first doped layer 108, and a second or lower surface 122, opposite the first surface 124.

The second doped layer 112 is a p-doped GaN layer, which is epitaxially deposited or otherwise conventionally fabricated on the active layer 110. The p-doped GaN layer has a first or upper surface 120, epitaxially deposited or otherwise fabricated on the second surface 122 of the active layer 110, and a second or lower surface 118, opposite the first surface 120.

The first electrode 102 of LED 100 contains silver and has a first, upper and inner surface 116 and a second, lower or outer surface 114, opposite the first surface 116. The upper surface 116 reflects light.

The second electrode 106 contains a gold alloy, which is deposited or otherwise conventionally fabricated on the first doped layer 108. The second electrode 106 has a first, inner or lower surface 130, deposited or fabricated on the first surface 128 of the first doped layer 108, and a second, outer or upper surface 132, opposite the first surface 130.

The second electrode 106 only partially covers the surface 128 of the first doped layer 108. Portions of the surface 128 of the first doped layer 108, not covered by the second electrode 106, are exposed and those exposed portions of the surface 128 of the first doped layer 108 are an output or exit surface for the light emitted by the LED 100.

The light emitting diode 100 has a first electrode 102, a layered semiconductor structure 104 having a first doped layer 108, an active layer 110 and a second doped layer 112, and a second electrode 106. The total thickness of the layered semiconductor structure 104 is usually on the order of a few microns. For example, the total thickness of the layered semiconductor structure 104 can be two to four microns.

The active region 110 emits internally generated light in an emitting wavelength range when an electrical current is applied through the first electrode 102 and the second electrode 106. The emitting wavelength range can include any optical wavelength. GaN-based LEDs generally emit light from about 300 nm to about 550 nm. The wavelength of the emitted light depends on the composition of the active layer.

The top surface 128 of the layered semiconductor structure 104 that is not covered by the second electrode 106 may be roughened (not shown) to enhance light extraction from LED 100.

Example light rays 134 and 138 in FIG. 1 illustrate internally generated light that is emitted by the active layer 110. Active layer 110 emits internally generated light ray 134 toward the outer surface 128 of the first doped layer 108 of LED 100. Internally generated light ray 134 is directed at an angle 136 that is greater than the critical angle for output surface 128. Internally generated light ray 134 is reflected by total internal reflection and is redirected toward internal reflective surface 116 of the first electrode 106.

Internally generated light ray 138 is emitted by active layer 110 toward the outer surface 128 of the first doped layer 108 of LED 100. Internally generated light ray 138 is directed at an angle 140 that is less than the critical angle for outer surface 128. Internally generated light ray 138 is transmitted through outer surface 128.

The embodiments of this invention that are described below improve the processes for fabricating LEDs and improve the light output of LEDs.

Figure 2:
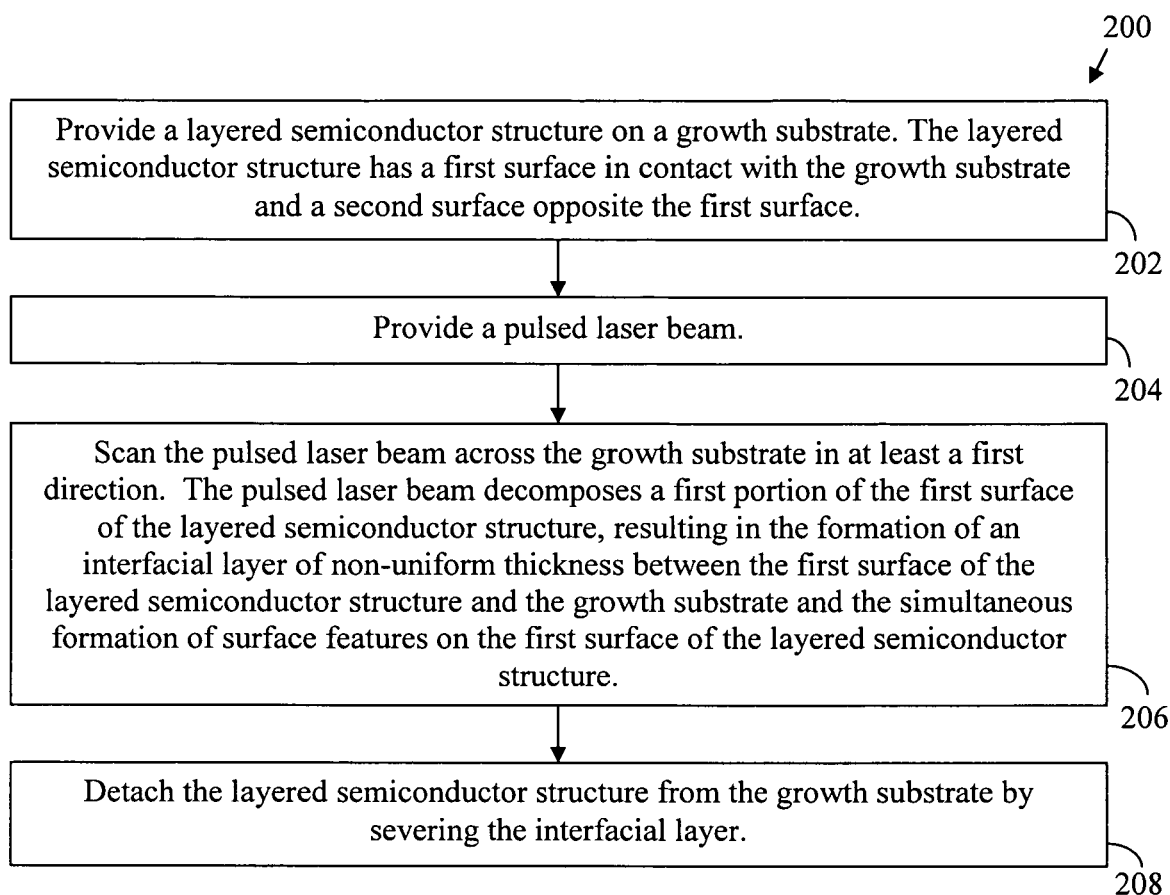
FIG. 2 is a flow diagram of one embodiment of this invention

FIG. 2 is a flow diagram 200 for an improved method for separating a layered semiconductor layer from a growth substrate and simultaneously forming surface features on one surface of the layered semiconductor structure. FIGS. 3 to 7 further illustrate the steps for this method.

Figure 3A:
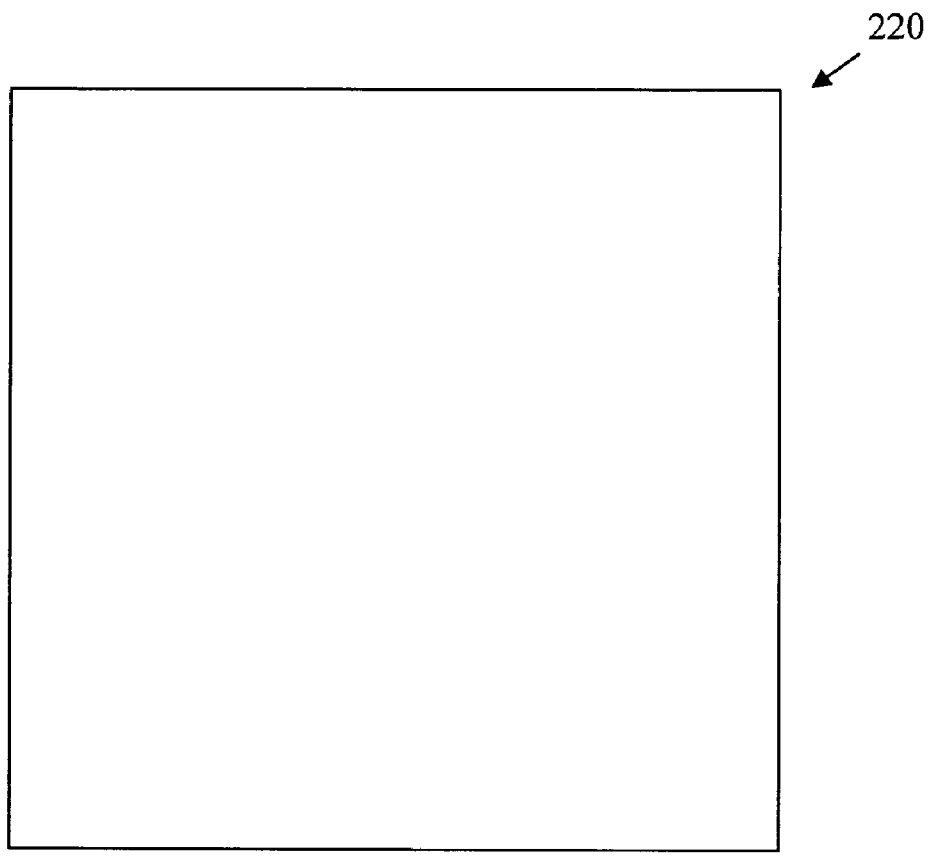
FIG. 3A is a top plan view of an assembly that includes a growth substrate and a layered semiconductor structure.
Figure 3B:
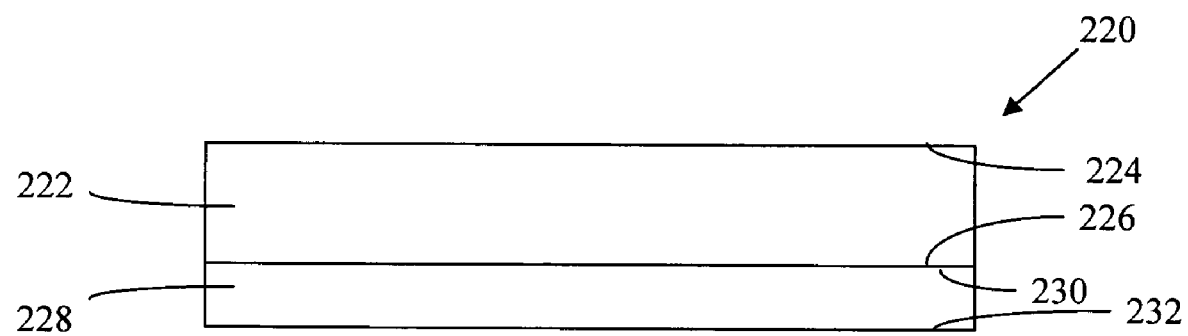
FIG. 3B is a side cross-sectional view of the assembly illustrated in FIG. 3A.

In step 202 of flow diagram 200, a layered semiconductor structure is provided on an optically transparent growth substrate. FIGS. 3A and 3B illustrate the corresponding assembly 220 that includes a growth substrate 222 and a layered semiconductor structure 228. FIG. 3A is a top plan view of assembly 220 and FIG. 3B is a side cross-section view of the assembly. The growth substrate 222 has a first or top surface 224 and a second or bottom surface 226 opposite the first surface 224. The layered semiconductor structure 228 has a first or top surface 230 and a second or bottom surface 232 opposite the first surface 230. The top surface 230 of the layered semiconductor structure is in contact with the bottom surface 226 of the growth substrate.

The layered semiconductor structure 228 can be fabricated from any semiconductor material or combination of semiconductor materials. Example materials include GaN-based materials such as GaN, AlN, AlGaN, InN, InGaN and AlInGaN as well as other semiconductor materials including AlGaInP, GaAs, AlGaAs, InGaAs, InGaAsP, AlGaInP, InP, SiC, Si, ZnO or diamond. Preferred semiconductor materials are GaN-based material such as GaN, AlN, AlGaN, InN, InGaN and AlInGaN. The layered semiconductor structure can be a uniform layer of a single material or multiple layers of differing materials. If the layered semiconductor structure 228 includes two layers, for example, then the composition of the layered semiconductor structure at surface 230 will differ from the composition of the layered semiconductor structure at surface 232. The optical absorptions of GaN, AlN, AlGaN, InN, InGaN and AlInGaN differ, but these materials generally strongly absorb light in a portion of the wavelength range from about 200 nm to about 360 nm. The layered semiconductor structure 228 can be grown by any standard semiconductor growth technique including, but not limited to, chemical vapor deposition (CVD), metal-organic chemical vapor deposition (MOCVD), liquid phase epitaxy (LPE), vapor phase epitaxy (VPE), hydride vapor phase epitaxy (HVPE) or molecular beam epitaxy (MBE).

The growth substrate 222 can be any substrate upon which the layered semiconductor structure 228 can be epitaxially grown. The growth substrate should be transparent to any laser beam utilized for subsequent processing. Example growth substrates for GaN-based materials include, but are not limited to, sapphire ($Al_2O_3$), silicon carbide (SiC), bulk GaN and bulk AlN. Sapphire is optically transparent in the 200-700 nm wavelength range and is a preferred substrate for this invention.

Figure 4:
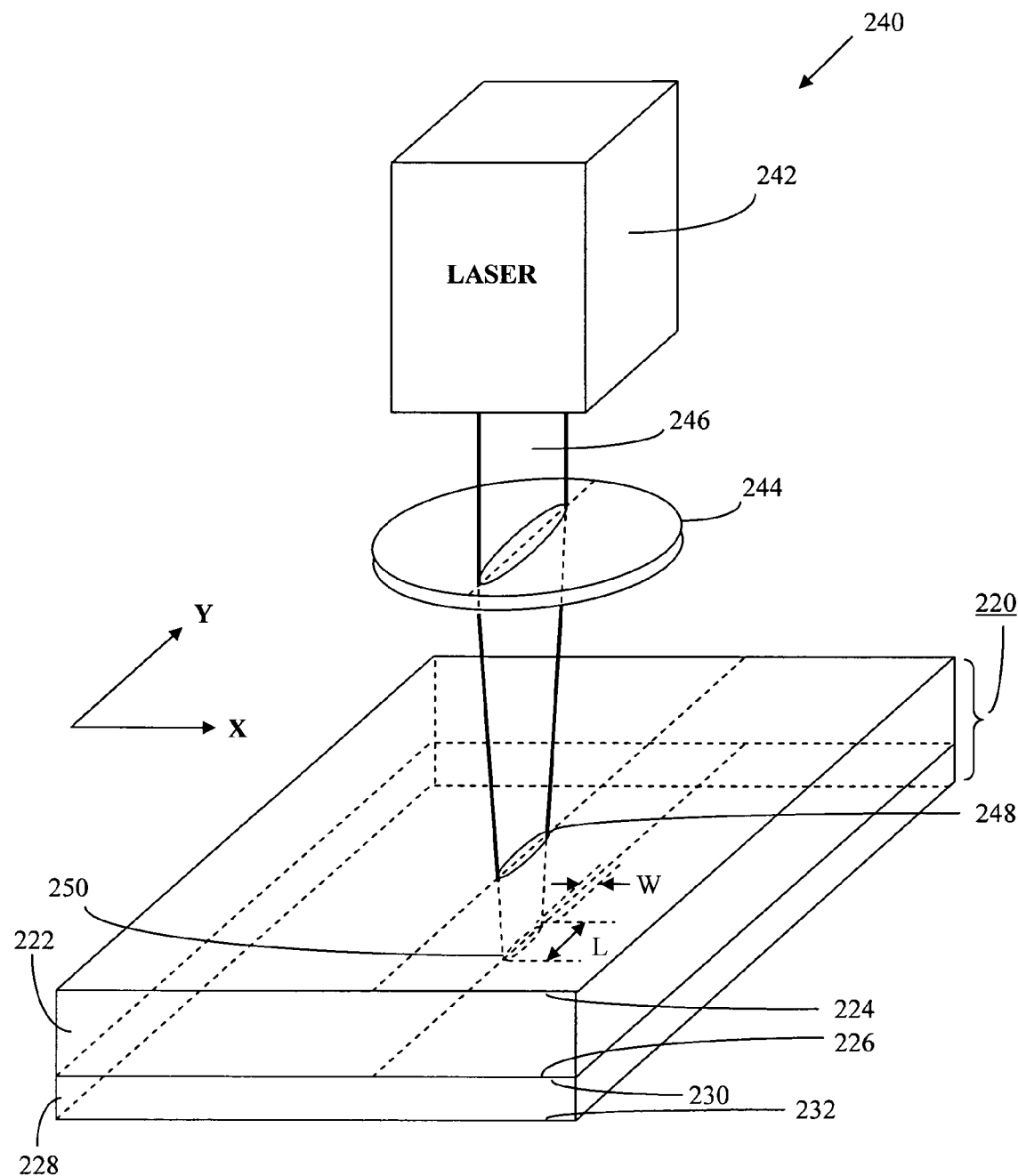
FIG. 4 is a prospective diagram of a laser system and an assembly that includes a growth substrate and a layered semiconductor structure.

In step 204 of flow diagram 200, a pulsed laser beam is provided. FIG. 4 is a schematic diagram of a laser system 240 that can provide a pulsed laser beam 246. The laser beam 246 can have any cross-sectional shape including, but not limited to, a circle, an oval, a square, a rectangle or a polygon. It is also possible to split a single laser beam into an array of laser beams. The array of laser beams can be a one-dimensional array or a two-dimensional array. Preferred laser beam shapes are elongated shapes such as ovals or rectangles and one-dimensional or two-dimensional arrays of laser beams. Elongated shapes or arrays of laser beams can cover more area per pulse resulting in faster scanning times. As an illustrative example, the shape of the laser beam in FIGS. 4 to 7 is an elongated beam in the shape of an oval. Laser system 240 includes a pulsed laser 242 and focusing optics 244. Focusing optics 244 can be a simple or compound lens that focuses the laser beam onto assembly 220. Pulsed lasers generally have a circular beam (for example, Nd:YAG lasers) or a rectangular beam (for example, excimer lasers). A circular beam can be converted into an elongated oval or elongated rectangular beam using either cylindrical lenses or a mask (neither is shown). A mask or an array of lenses may also be used to convert a single laser beam into an array of beams.

The elongated-shaped laser beam 246 illustrated in FIG. 4 passes through the focusing optics 244 and is directed to surface 224 of growth substrate 222. For purposes of illustration, the elongated-shaped laser beam passes through surface 224 at location 248, passes through the interior of the transparent growth substrate 222 and passes through surface 226 of growth substrate 222 at location 250. At location 250, the elongated-shaped laser beam has an approximate length L and an approximate width W, where L is greater than W. In FIG. 4, the laser beam is shown for simplicity to have distinct edges. However, a laser beam can have an intensity profile that is Gaussian, for example. If the laser beam has a Gaussian intensity profile, the ovals in FIG. 4 represent the cross-sectional shape of the beam at the regions of the beam that are, for example, 1/e as intense as at the center of the beam. For a Gaussian beam intensity profile, the majority of the beam energy will be inside the ovals, but some of the beam energy will extend outside the ovals.

The pulsed laser 242 in step 204 is any pulsed laser that has a wavelength that passes through the growth substrate with negligible absorption and then is strongly absorbed by the layered semiconductor structure. Example lasers that are strongly absorbed by GaN-based materials include, but are not limited to, a KrF excimer laser operating at 248 nm, a frequency-tripled Nd:YAG laser operating at 355 nm and a frequency-quadrupled Nd:YAG laser operating at 266 nm. A preferred laser is a frequency-quadrupled Nd:YAG laser operating at 266 nm. An exemplary pulsed, frequency-quadrupled, Nd:YAG laser is a diode-pumped-solid-state (DPSS) laser. A pulsed, DPSS, Nd:YAG laser operating at 266 nm can have a pulse repetition rate of 200,000 Hertz or higher. Pulse lengths are typically 5 to 30 nanoseconds.

In step 206 of flow diagram 200, the pulsed laser beam is scanned across the growth substrate in at least a first direction. The pulsed laser beam is transmitted through the growth substrate and absorbed at the first or upper surface of the layered semiconductor structure. The pulsed laser beam decomposes a first portion of the first or upper surface of the layered semiconductor structure, resulting in the formation of an interfacial layer of non-uniform thickness between the first or upper surface of the layered semiconductor structure and the second or bottom surface of the growth substrate. Simultaneously, the pulsed laser beam forms surface features on the first or upper surface of the layered semiconductor structure. By forming an interfacial layer for subsequent growth substrate removal and by simultaneously forming surface features in one step, this invention reduces the number of steps required to fabricate LEDs.

FIGS. 4, 5A, 5B, 6A and 6B illustrate step 206. The first direction can be, for example, the X-direction (plus or minus) or the Y-direction (plus or minus). In FIGS. 5A, 5B, 6A and 6B, the scan direction is the X-direction (plus or minus) and the illustrative, elongated-shaped laser beam is raster scanned sequentially first in the plus X direction and then in the minus X direction. Referring to FIG. 4, the laser scanning can be done either by scanning the laser beam 246 in the plus X or minus X direction and leaving assembly 220 stationary or by scanning assembly 220 in the minus X or plus X direction and leaving the laser beam 246 stationary. Preferably the laser scanning is done by scanning assembly 220.

Figure 5A:
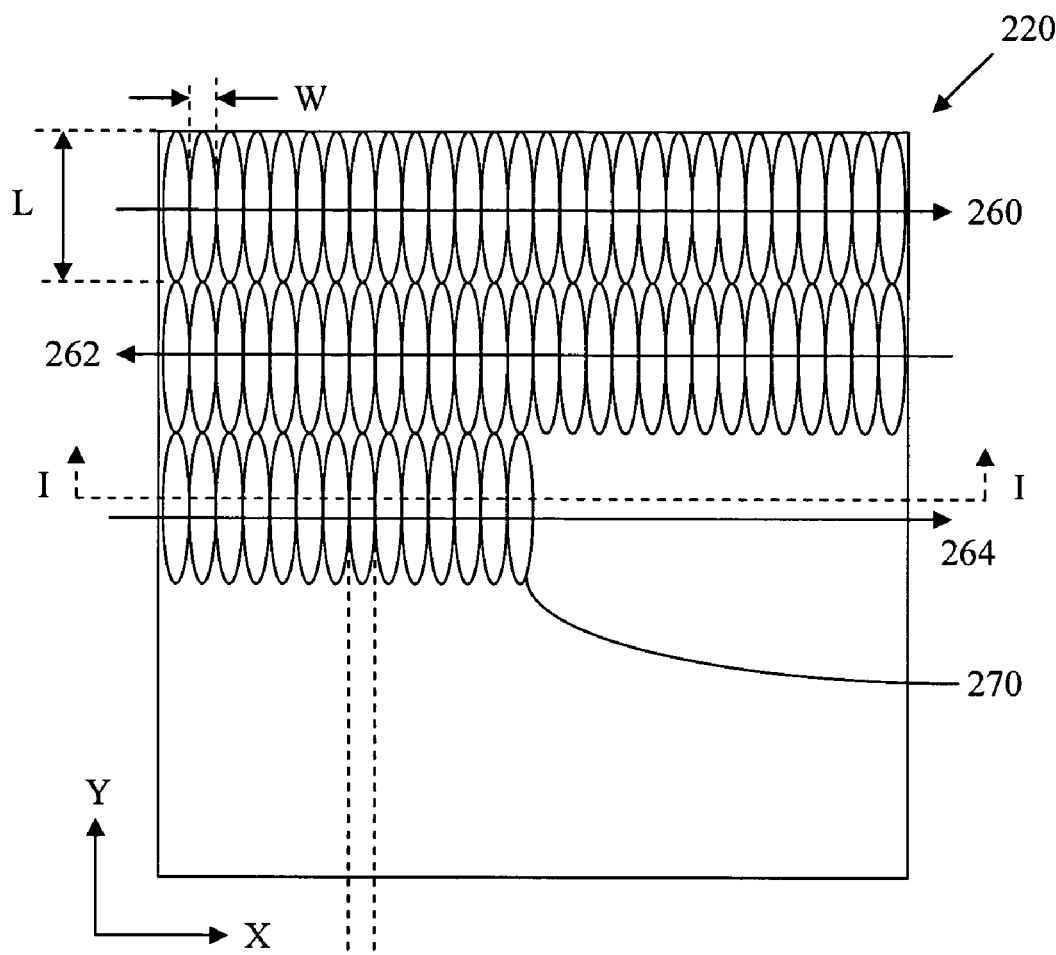
FIG. 5A is a top plan view of an assembly showing a pattern formed by a pulsed laser beam scanned in the X direction across a portion of the surface of the assembly.

FIG. 5A is a top plan view of assembly 220 showing a full laser scan 260 in the plus X direction, a full laser scan 262 in the minus X direction and a partial laser scan 264 in the plus X direction. When the laser beam 246 that was illustrated in FIG. 4 is absorbed by the layered semiconductor structure 228 at surface 230, the surface 230 is decomposed and an interfacial layer 272 (see FIG. 5B) of non-uniform thickness is formed. At the same time as the interfacial layer is formed, the laser pulses simultaneously form surface features 274 on the upper surface 230 of the layered semiconductor structure. The surface features are formed in the regions between the centers of the oval laser pulses. The centers of the surface features are at the edges of the ovals. If the surface of the layered semiconductor structure is GaN, for example, the laser will decompose the GaN into gallium metal and nitrogen gas and form an interfacial layer 272 of non-uniform thickness that is primarily gallium metal. Each oval 270 represents the approximate length L and width W of the repeating pattern of an interfacial layer 272 that is formed when a single laser pulse having an oval cross-sectional shape decomposes the upper surface 230 of the layered semiconductor structure 228. Successive laser pulses form a series of ovals as the laser beam is scanned across the layered semiconductor structure. The ovals 270 are shown as having distinct edges. However, laser beams can have Gaussian shapes, for example, and do not necessarily have distinct edges. The resulting ovals 270 likewise will not have sharp edges. A portion of the laser beam extends outside the areas of the ovals, resulting in some decomposition outside the boundaries of the ovals. The extended beam areas outside the ovals will overlap resulting in a continuous interfacial layer 272 of non-uniform thickness that covers the entire surface area that has been scanned.

Figure 5B:
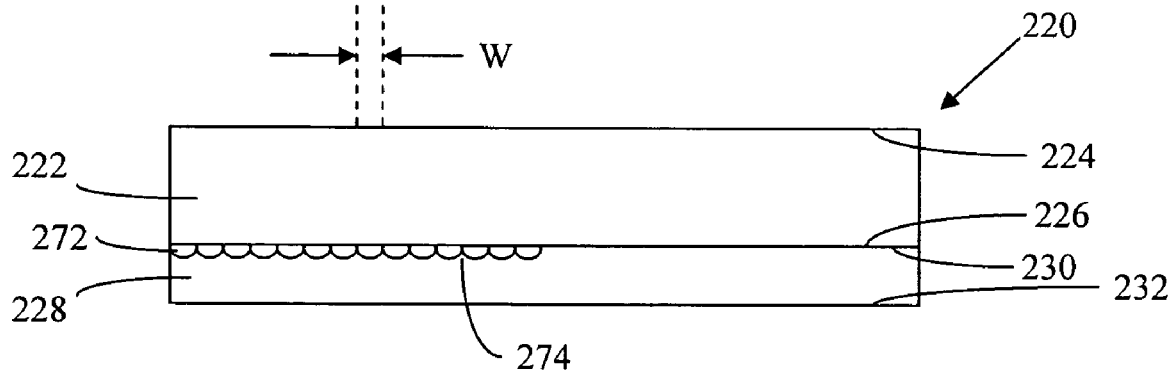
FIG. 5B is a side cross-sectional view along the I-I plane of the assembly illustrated in FIG. 5A and shows the interfacial layer formed by the laser beam.

FIG. 5B, which is a side cross-sectional view along the I-I plane of the assembly 220 illustrated in FIG. 5A, illustrates the thickness variation of the interfacial layer 272 and the profile of the surface features 274 that are formed on the upper surface 230 of the layered semiconductor structure 228. The thickness of the interfacial layer 272 varies depending on the intensity of the laser beam at each point on the scanned surface 230. At the center of an oval 270, which corresponds to the center of the laser pulse where the laser beam has the highest intensity, the interfacial layer 272 will be thicker than at the edges of the oval.

The surface features 274 on surface 230 have shapes that depend on the intensity profile of the laser beam. In FIG. 5B, the surface features on surface 230 have curved sidewalls and pointed tips. However, the surface features may also have planar sidewalls and the tips may be rounded or flat rather than pointed.

A DPSS laser is a preferred laser for doing the laser scans of assembly 220. A DPSS laser can have a pulse repetition rate of 200,000 Hertz or higher compared to a few hundred or few thousand Hertz for an excimer laser. If each laser pulse of a DPSS laser exposes a 3 micron wide by 20 micron long region, for example, the exposed area per pulse is 60 square microns. If the pulse repletion rate is 200,000 Hertz, then a square centimeter of area can be scanned in approximately 8 seconds.

Figure 6A:
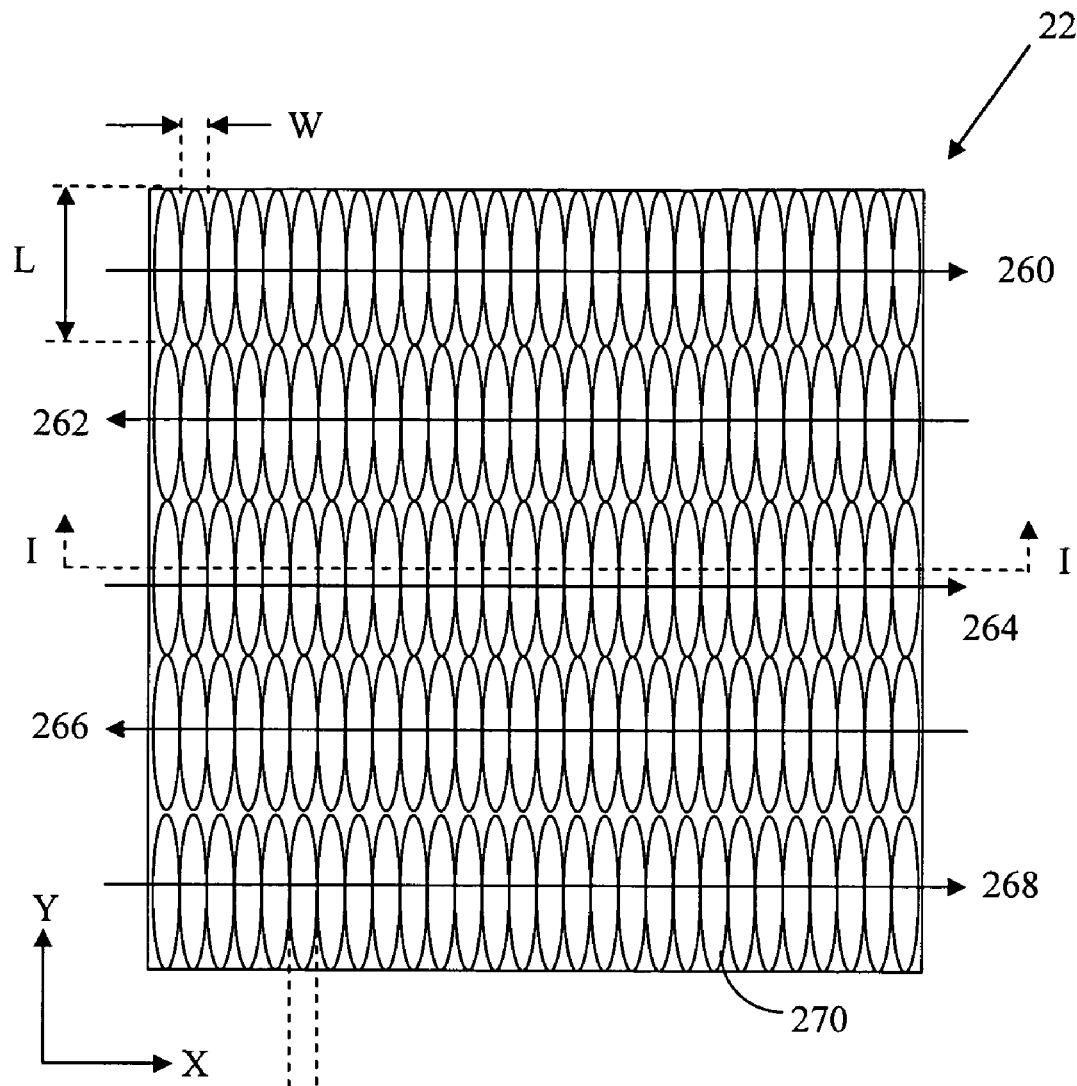
FIG. 6A is a top plan view of an assembly showing a pattern formed by a pulsed laser beam scanned in the X direction across the entire surface of the assembly.
Figure 6B:
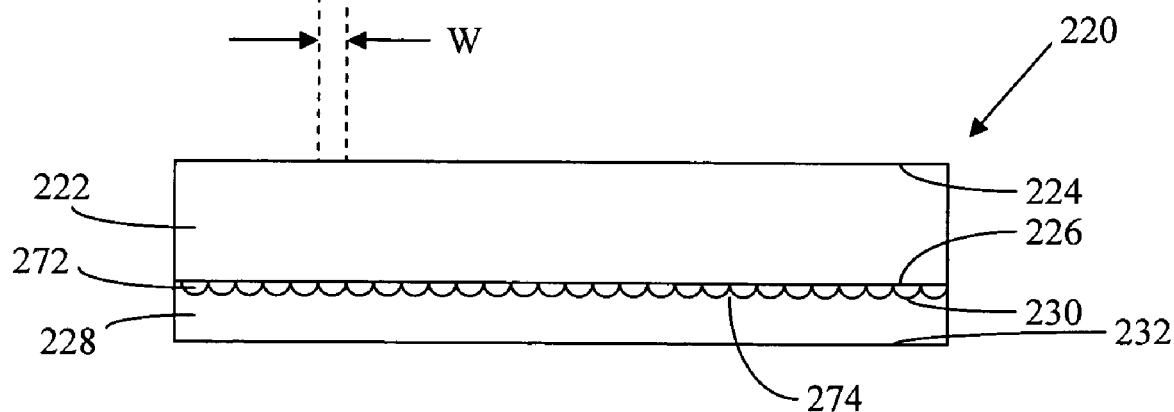
FIG. 6B is a side cross-sectional view along the I-I plane of the assembly illustrated in FIG. 6A and shows the interfacial layer formed by the laser beam.

FIGS. 6A and 6B illustrate laser scans that cover the entire surface of assembly 220. FIG. 6A is a top plan view of assembly 220. FIG. 6B is a side cross-sectional view along the I-I plane shown in FIG. 6A. Scans 260, 264 and 268 are in the plus X direction. Scans 262 and 266 are in the minus X direction. Alternatively, the scans can all be done in one direction, such as the plus X direction or the minus X direction. Each oval pattern 270 represents the approximate extent of the interfacial layer 272 (see FIG. 6B) formed when a single laser pulse decomposes surface 230 of the layered semiconductor structure 228.

Figure 7:
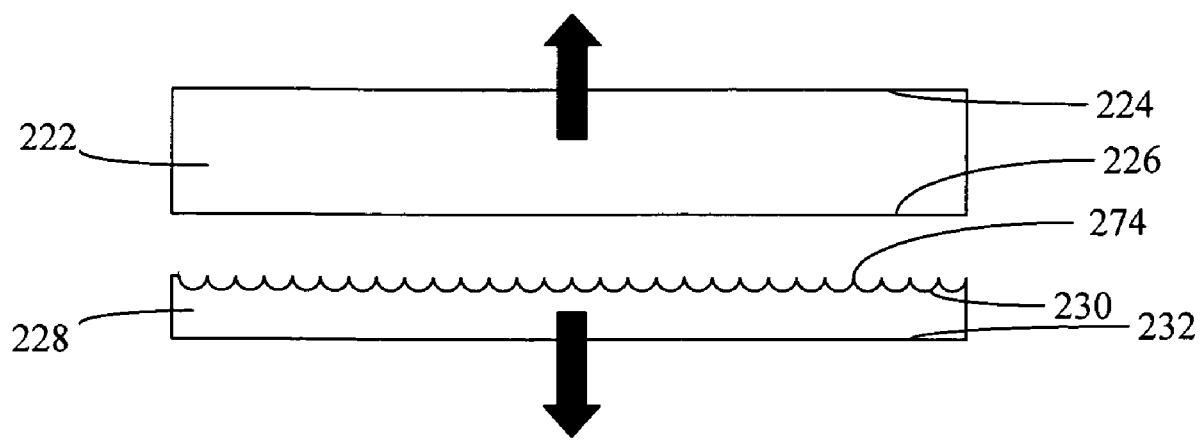
FIG. 7 is a side cross-sectional view illustrating the detachment of the growth substrate from the layered semiconductor structure.

In step 208 of flow diagram 200, the layered semiconductor structure is detached from the growth substrate by severing the interfacial layer. FIG. 7 illustrates step 208.

If the layered semiconductor structure is a GaN-based material, the interfacial layer will consist of gallium metal and any nitrogen gas that is trapped in the interfacial layer. Gallium metal has a melting point of approximately 30 degrees Celsius. To detach the layered semiconductor structure from the growth substrate, the assembly 220 can be heated to a temperature above 30 degrees Celsius to melt the gallium and allow for easy separation. Any residue of gallium metal that remains on the layered semiconductor structure can be removed by a cleaning step (not shown). For example, any gallium metal residue can be removed using a 50:50 volumetric mixture of hydrogen chloride (HCl) and water.

Figure 8:
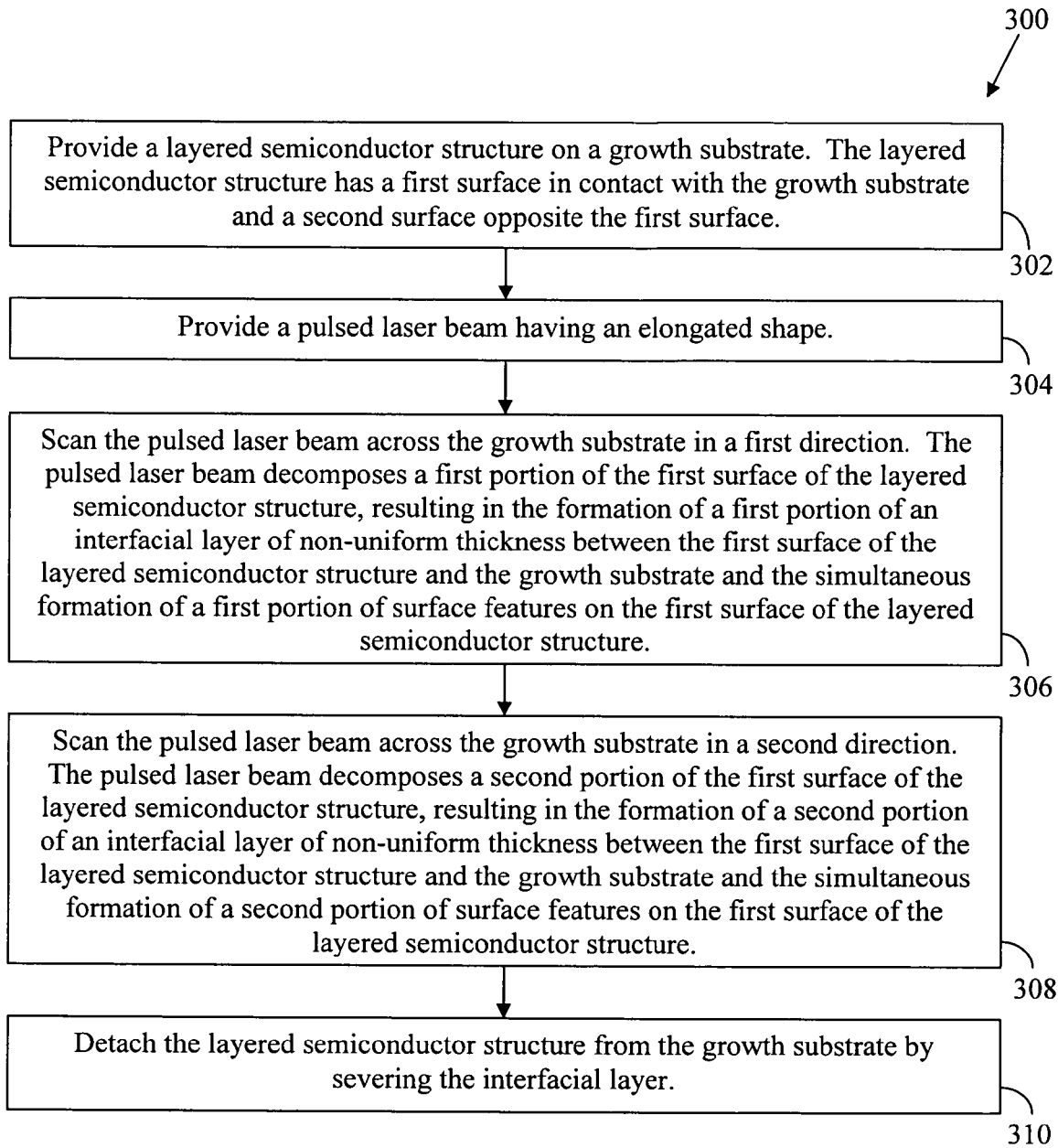
FIG. 8 is a flow diagram of another embodiment of this invention.

Another embodiment of this invention is illustrated in FIGS. 8 to 12. FIG. 8 is a flow diagram 300 for an improved method for separating a layered semiconductor layer from a growth substrate and simultaneously forming surface features on one surface of the layered semiconductor structure. FIGS. 3 to 4 and FIGS. 9 to 12 further illustrate the steps for this method. This embodiment is similar to the previous embodiment except that laser scans are done in a first direction and then in a second direction, where the second direction is at an angle to the first direction.

In step 302 of flow diagram 300, a layered semiconductor structure is provided on a growth substrate. The previous FIGS. 3A and 3B illustrate the corresponding assembly 220 that includes a growth substrate 222 and a layered semiconductor structure 228. The growth substrate 222 has a first or top surface 224 and a second or bottom surface 226 opposite the first surface 224. The layered semiconductor structure 228 has a first or top surface 230 and a second or bottom surface 232 opposite the first surface 230. The top surface 230 of the layered semiconductor structure is in contact with the bottom surface 226 of the growth substrate.

The layered semiconductor structure 228 can be fabricated from any semiconductor material or combination of semiconductor materials. Example materials include GaN-based materials such as GaN, AlN, AlGaN, InN, InGaN and AlInGaN as well as other semiconductor materials including AlGaInP, GaAs, AlGaAs, InGaAs, InGaAsP, AlGaInP, InP, SiC, Si, ZnO or diamond. Preferred semiconductor materials are GaN-based material such as GaN, AlN, AlGaN, InN, InGaN and AlInGaN. The layered semiconductor structure can be a uniform layer of a single material or multiple layers of differing materials.

The growth substrate 222 can be any optically transparent substrate upon which the layered semiconductor structure 228 can be epitaxially grown. Example growth substrates for GaN-based materials include, but are not limited to, sapphire ($Al_2O_3$), silicon carbide (SiC), bulk GaN and bulk AlN. Sapphire is a preferred substrate for this invention.

In step 304 of flow diagram 300, a pulsed laser beam having an elongated shape is provided. The previous FIG. 4 is a schematic diagram of a laser system 240 that can provide a pulsed laser beam 246. The laser beam 246 can have any elongated shape including, but not limited to, an oval or a rectangle. As an illustrative example, the elongated shape of the laser beam in FIG. 4 and FIGS. 9 to 12 is an oval. Laser system 240 includes a pulsed laser 242 and focusing optics 244. Focusing optics 244 can be a simple or compound lens that focuses the laser beam onto assembly 220. The elongated-shaped laser beam 246 illustrated in FIG. 4 passes through the focusing optics 244 and is directed to surface 224 of growth substrate 222. For purposes of illustration, the elongated-shaped laser beam passes through surface 224 at location 248, passes through the interior of the transparent growth substrate 222 and passes through surface 226 of growth substrate 222 at location 250. At location 250, the elongated-shaped laser beam has an approximate length L and an approximate width W, where L is greater than W. In FIG. 4, the laser beam is shown for simplicity to have distinct edges. However, laser beams can have Gaussian shapes, for example, and generally do not have distinct edges.

The pulsed laser 242 in step 304 is any pulsed laser that has a wavelength that passes through the growth substrate with negligible absorption and then is strongly absorbed by the layered semiconductor structure. A preferred laser is a frequency-quadrupled Nd:YAG laser operating at 266 nm. An exemplary frequency-quadrupled Nd:YAG laser is a diode-pumped-solid-state (DPSS), frequency-quadrupled Nd:YAG laser. A pulsed, DPSS, Nd:YAG laser operating at 266 nm can have a pulse repetition rate of 200,000 Hertz or higher. Pulse lengths are typically 5-30 nanoseconds.

In step 306 of flow diagram 300, the pulsed laser beam is scanned across the growth substrate in a first direction. The pulsed laser beam is transmitted through the growth substrate and absorbed at the first or upper surface of the layered semiconductor structure. The pulsed laser beam decomposes a first portion of the first or upper surface of the layered semiconductor structure, resulting in the formation of a first portion of an interfacial layer of non-uniform thickness located between the first or upper surface of the layered semiconductor structure and the second or bottom surface of the growth substrate. Simultaneously, the pulsed laser beam forms a first portion of surface features on the first or upper surface of the layered semiconductor structure.

In step 308 of flow diagram 300, the pulsed laser beam is scanned across the growth substrate in a second direction. The second direction is at an angle to the first direction. The angle can be any angle from 1 degree to 179 degrees. Preferred angles range from 60 degrees to 120 degrees. More preferred angles range from 85 degrees to 95 degrees. The most preferred angle is 90 degrees. As an illustrative example, the angle for the second direction in FIGS. 9 to 12 is 90 degrees.

The pulsed laser beam is transmitted through the growth substrate and absorbed at the first or upper surface of the layered semiconductor structure. The pulsed laser beam decomposes a second portion of the first or upper surface of the layered semiconductor structure, resulting in the formation of a second portion of an interfacial layer of non-uniform thickness located between the first or upper surface of the layered semiconductor structure and the second or bottom surface of the growth substrate. Simultaneously, the pulsed laser beam forms a second portion of surface features on the first or upper surface of the layered semiconductor structure.

FIGS. 9 to 12 illustrate steps 306 and 308. The first direction can be, for example, the X-direction (plus or minus). The second direction can be, for example, the Y-direction (plus or minus). In order to simplify the figure, FIG. 9A is a top plan view of assembly 220 illustrating two laser scans, a single laser scan 324 in a first plus X direction and a single laser scan 334 in a second minus Y direction. The two scans overlap in the center of assembly 220. FIG. 9B is a side cross-sectional view of assembly 220 along the I-I plane shown in FIG. 9A. FIG. 9C is a side cross-sectional view of assembly 220 along the II-II plane shown in FIG. 9A.

During the laser scan 324 in the plus X direction, the laser beam 246 that was illustrated in FIG. 4 is absorbed by the layered semiconductor structure 228 at surface 230. A first portion of the surface 230 is decomposed and first portion 372 of an interfacial layer 376 (see FIG. 9B) of non-uniform thickness is formed. At the same time as the interfacial layer is formed, the laser pulses simultaneously form a first portion 374 of surface features on the upper surface 230 of the layered semiconductor structure. The first portion of surface features is formed in the regions between the centers of the laser pulses. The centers of the first portion of surface features are at the edges of the oval patterns 370 illustrated by solid lines. If the surface of the layered semiconductor structure is GaN, for example, the laser will decompose the GaN into gallium metal and nitrogen gas and form a first portion 372 of an interfacial layer 376 of non-uniform thickness that is primarily gallium metal. Each oval pattern 370 represents the approximate length L and width W of the first portion 372 of the interfacial layer 376 that is formed when a single laser pulse having an oval cross-sectional shape decomposes the upper surface 230 of the layered semiconductor structure 228. Successive laser pulses form a series of ovals as the laser beam is scanned across the layered semiconductor structure. The ovals 370 are shown as having distinct edges. However, laser beams can have Gaussian shapes, for example, and do not necessarily have distinct edges. The resulting ovals 370 likewise will not have sharp edges. The first portion 372 of the interfacial layer 376 at least partially covers the portion of surface 230 that is within the area of laser scan 324.

Figure 9A:
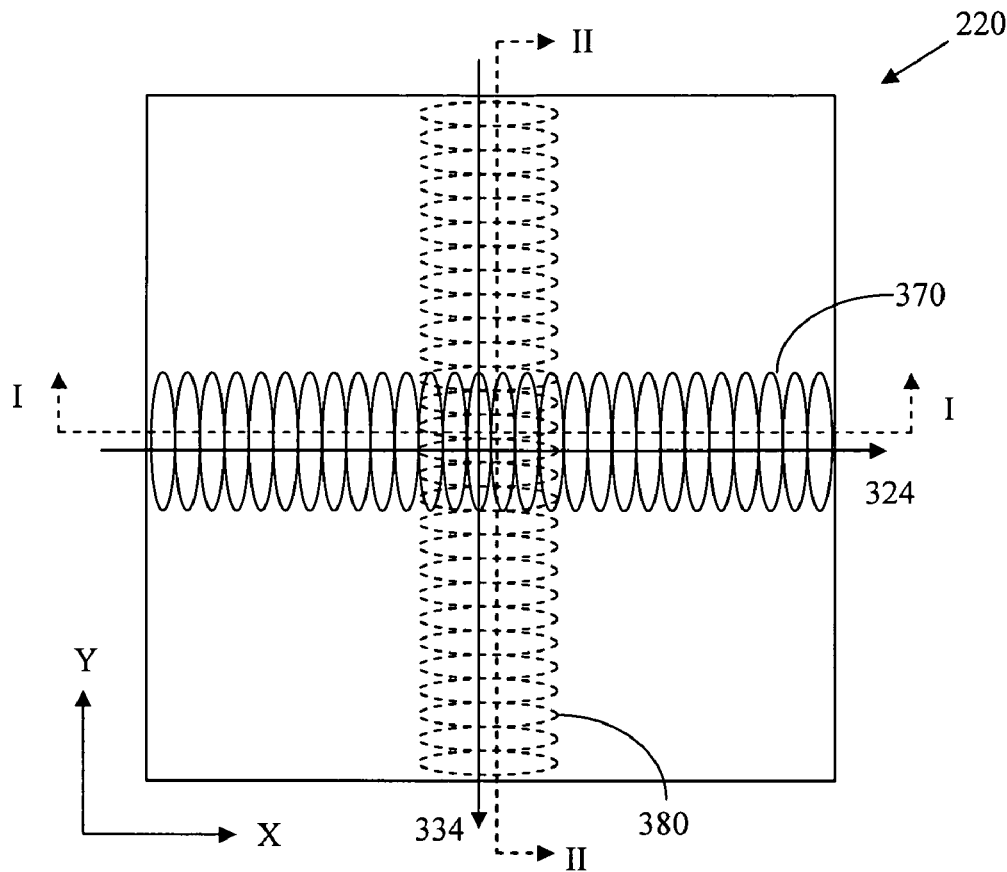
FIG. 9A is a top plan view of an assembly showing a pattern formed by a pulsed laser beam scanned in both the X direction and the Y direction across a portion of the surface of the assembly.
Figure 9B:
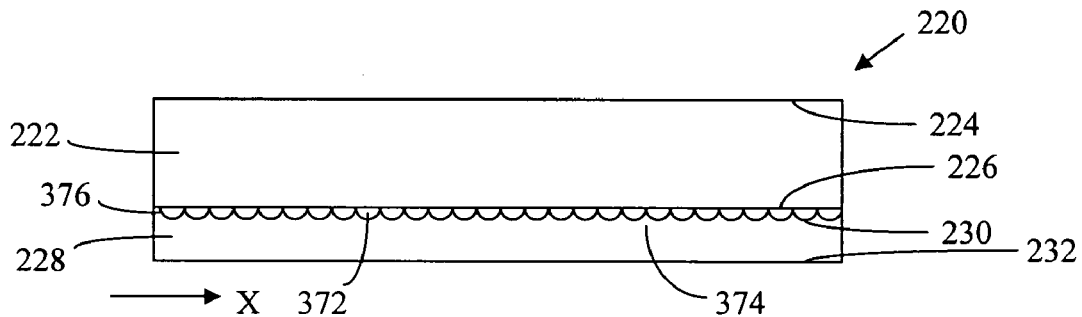
FIG. 9B is a side cross-sectional view along the I-I plane of the assembly illustrated in FIG. 9A and shows the interfacial layer formed by the laser beam.

FIG. 9B, which is a side cross-sectional view along the I-I plane of the assembly 220 illustrated in FIG. 9A, illustrates the thickness variation of the first portion 372 of the interfacial layer 376 and the profile of the first portion 374 of the surface features that are formed on the upper surface 230 of the layered semiconductor structure 228. The thickness of the first portion 372 of the interfacial layer 376 varies depending on the intensity of the laser beam at each point on the scanned surface 230. At the center of an oval 370, which corresponds to the center of the laser pulse where the laser beam has the highest intensity, the first portion 372 of the interfacial layer will be thicker than at the edges of the oval.

The first portion 374 of the surface features on surface 230 has shapes that depend on the intensity profile of the laser beam. In FIG. 9B, the surface features on surface 230 have curved sidewalls and pointed tips. However, the surface features may also have planar sidewalls and the tips may be rounded rather than pointed.

During the laser scan 334 in the minus Y direction, the laser beam 246 that was illustrated in FIG. 4 is absorbed by the layered semiconductor structure 228 at surface 230. A second portion of the surface 230 is decomposed and a second portion 382 of the interfacial layer 376 (see FIG. 9C) of non-uniform thickness is formed. At the same time as second portion 382 of the interfacial layer is formed, the laser pulses simultaneously form a second portion 384 of the surface features on the upper surface 230 of the layered semiconductor structure. The second portion of the surface features is formed in the regions between the centers of the laser pulses. The centers of the second portion of the surface features are at the edges of the oval patterns 380 that are illustrated by dashed lines. Each oval 380 represents the approximate length L and width W of the second portion 382 of the interfacial layer 376 that is formed when a single laser pulse having an oval cross-sectional shape decomposes the upper surface 230 of the layered semiconductor structure 228. Successive laser pulses form a series of ovals as the laser beam is scanned across the layered semiconductor structure. The ovals 380 are shown as having distinct edges. However, laser beams can have Gaussian shapes, for example, and do not necessarily have distinct edges. The resulting ovals 380 likewise will not have sharp edges. The second portion 382 of the interfacial layer 376 at least partially covers the portion of surface 230 that is within the area of laser scan 334. The first portion 372 of the interfacial layer 376 and the second portion 382 of the interfacial layer 376 cover the entirety of the portion of surface 230 where the laser scans 324 and 334 overlap.

Figure 9C:
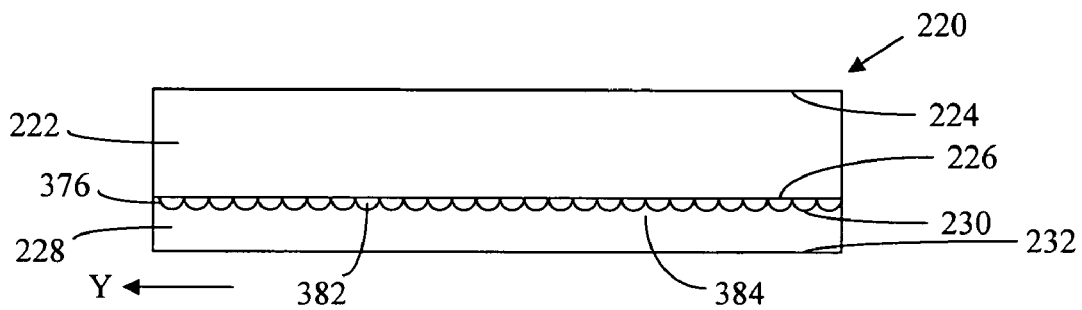
FIG. 9C is a side cross-sectional view along the II-II plane of the assembly illustrated in FIG. 9A.

FIG. 9C, which is a side cross-sectional view along the I-I plane of the assembly 220 illustrated in FIG. 9A, illustrates the thickness variation of the second portion 382 of the interfacial layer 376 and the profile of the second portion 384 of the surface features that are formed on the upper surface 230 of the layered semiconductor structure 228. At the center of an oval 380, which corresponds to the center of the laser pulse where the laser beam has the highest intensity, the second portion 382 of the interfacial layer 376 will be thicker than at the edges of the oval.

The second portion 384 of the surface features on surface 230 has shapes that depend on the intensity profile of the laser beam. In FIG. 9C, the surface features on surface 230 have curved sidewalls and pointed tips. However, the second portion of the surface features may also have planar sidewalls and the tips may be rounded rather than pointed.

Figure 10A:
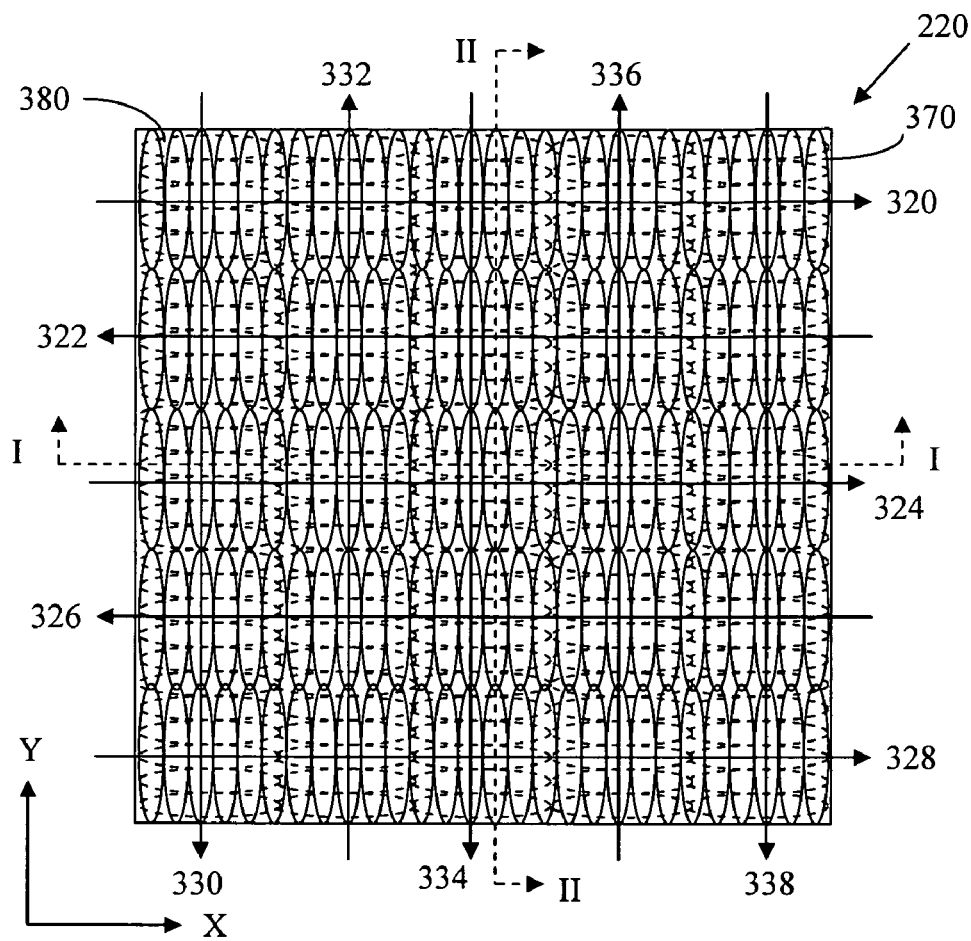
FIG. 10A is a top plan view of an assembly showing a pattern formed by a pulsed laser beam scanned in both the X direction and the Y direction across the entire surface of the assembly.
Figure 10B:
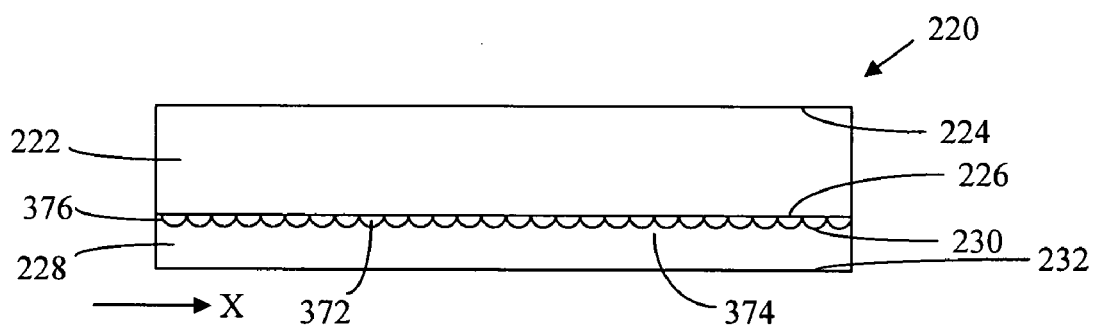
FIG. 10B is a side cross-sectional view along the I-I plane of the assembly illustrated in FIG. 10A and shows the interfacial layer formed by the laser beam.
Figure 10C:
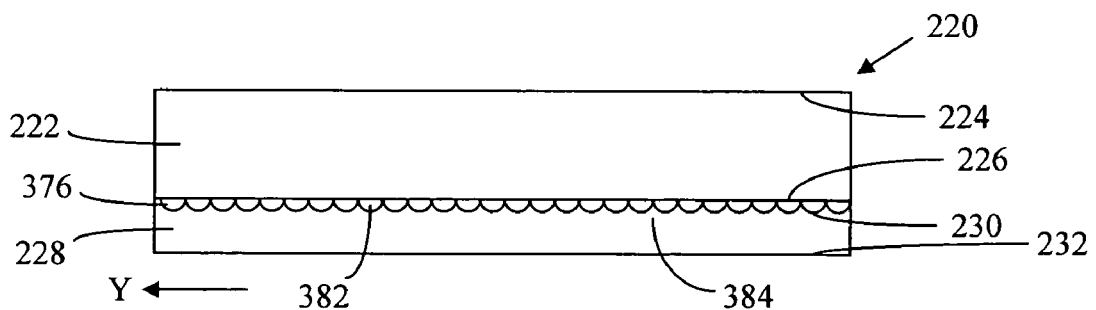
FIG. 10C is a side cross-sectional view along the II-II plane of the assembly illustrated in FIG. 10A.

FIGS. 10A to 10C illustrate laser scans that cover the entirety of surface 230 of assembly 220. FIG. 10A is a top plan view of assembly 220. FIG. 10B is a side cross-sectional view along the I-I plane shown in FIG. 10A. Scans 320, 324 and 328 are in the plus X direction. Scans 322 and 326 are in the minus X direction. Alternatively, the scans can all be done in one direction, such as the plus X direction or the minus X direction. Each solid oval pattern 370 represents the approximate extent of the portion 372 of the interfacial layer 376 (see FIG. 10B) formed when a single laser pulse decomposes surface 230 of the layered semiconductor structure 228.

FIG. 10C is a side cross-sectional view along the II-II plane shown in FIG. 10A. Scans 330, 334 and 338 are in the minus Y direction. Scans 332 and 336 are in the plus Y direction. Alternatively, the scans can all be done in one direction, such as the plus Y direction or the minus Y direction. Each dashed oval 380 represents the approximate extent of the portion 382 of the interfacial layer 376 (see FIG. 10C) formed when a single laser pulse decomposes surface 230 of the layered semiconductor structure 228. The first portion 372 of the interfacial layer 376 and the second portion 382 of the interfacial layer 376 cover the entirety of surface 230.

Figure 11:
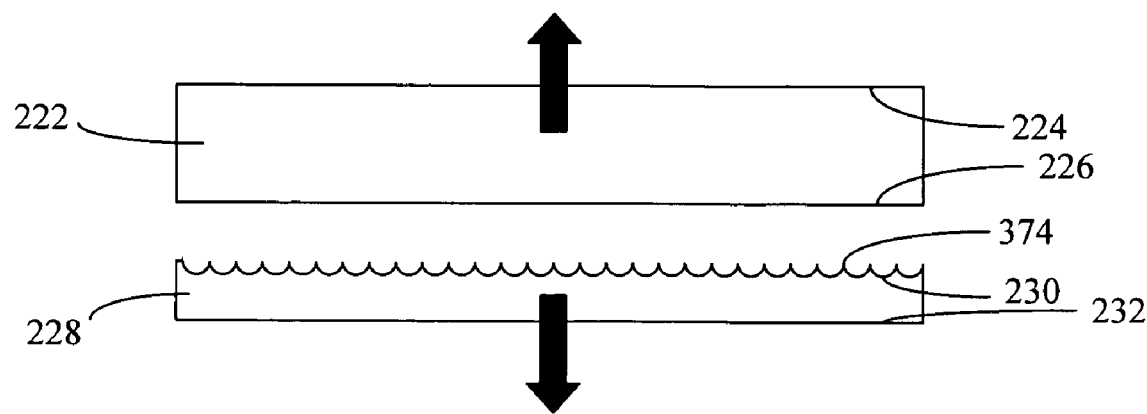
FIG. 11 is a side cross-sectional view illustrating the detachment of the growth substrate from the layered semiconductor structure.

In step 310 of flow diagram 300, the layered semiconductor structure is detached from the growth substrate by severing the interfacial layer. FIG. 11 illustrates step 310. If the layered semiconductor structure is GaN, the interfacial layer will consist of gallium metal and any nitrogen gas that is trapped in the interfacial layer. Gallium metal has a melting point of approximately 30 degrees Celsius. To detach the layered semiconductor structure from the growth substrate, the assembly 220 can be heated to a temperature above 30 degrees Celsius to melt the gallium and allow for easy separation. Any residue of gallium metal that remains on the layered semiconductor structure can be removed by a cleaning step (not shown). For example, any gallium metal residue can be removed using a 50:50 volumetric mixture of hydrogen chloride (HCl) and water.

Figure 12A:
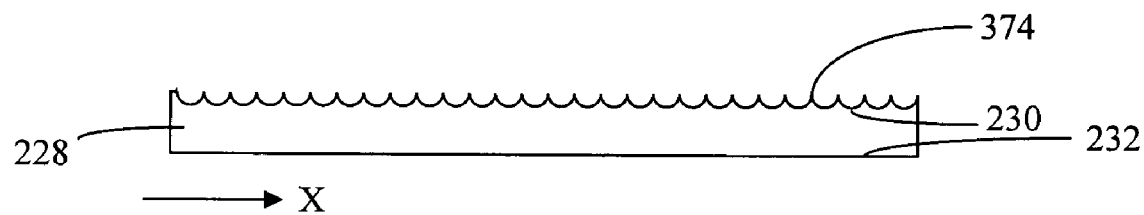
FIG. 12A is a side cross-sectional view of the layered semiconductor structure after the growth substrate is removed as viewed along the I-I plane illustrated in FIG. 10A.
Figure 12B:
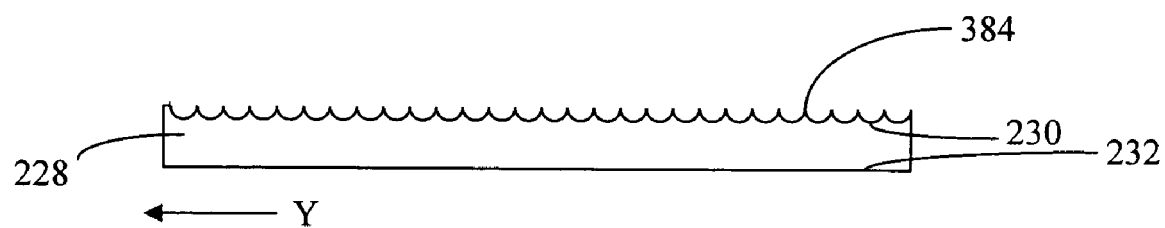
FIG. 12B is a side cross-sectional view of the layered semiconductor structure after the growth substrate is removed as viewed along the II-II plane illustrated in FIG. 10A.

FIG. 12A is a side cross-sectional view of the layered semiconductor structure 228 along the I-I plane illustrated in FIG. 10A. FIG. 12B is a side cross-sectional view of the layered semiconductor structure 228 along the II-II plane illustrated in FIG. 10A. Scanning an oval-shaped laser beam in the X direction forms portions 374 of the surface features. Scanning an oval-shaped laser beam in the Y direction forms portions 384 of the surface features. The surface features are illustrated to have curved sidewalls and pointed tips. However, the surface features may also have planar sidewalls and the tips may be rounded or flat rather than pointed. The two portions 374 and 384 of the surface features combine to form four-sided surface features (not shown). In this example, the four-sided surface features have curved sidewalls. However, it is within the scope of this invention that the sidewalls may be curved or planar. If the layered semiconductor structure has an n-doped layer, an active layer and a p-doped layer and if the layer semiconductor structure undergoes further processing steps to form an LED, then the four-sided surface features become light-extracting elements for the LED.

Figure 13:
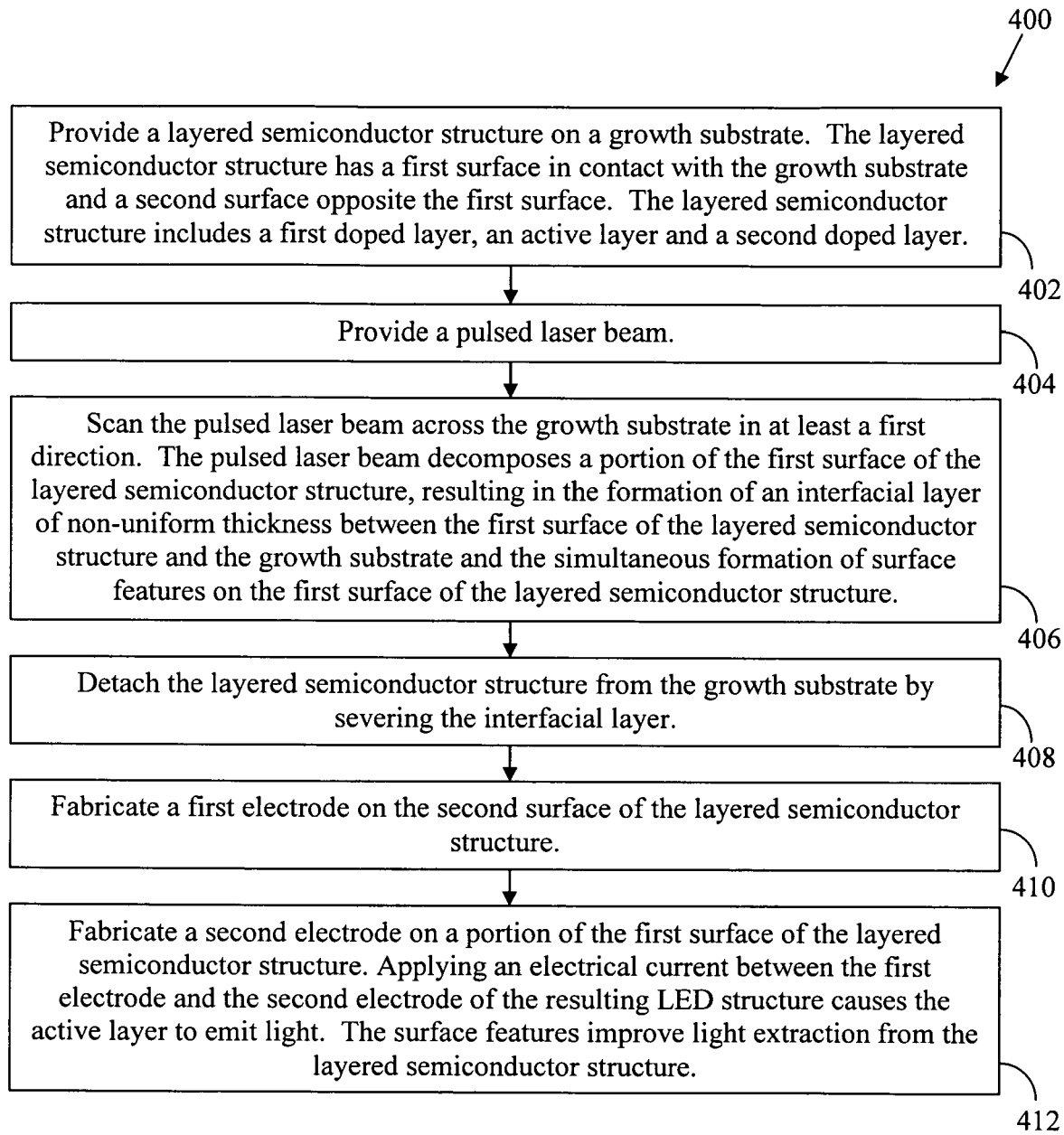
FIG. 13 is a flow diagram of a method for fabricating a light emitting diode.

Another embodiment of this invention is a method for fabricating an LED. FIG. 13 is a flow diagram 400 illustrating such a method. The method includes and expands upon the previously described method illustrated in FIG. 2, which is a method for separating a layered semiconductor layer from a growth substrate while simultaneously forming surface features on one surface of the layered semiconductor structure. FIGS. 14A to 14I illustrate the steps for flow diagram 400.

Figure 14A:
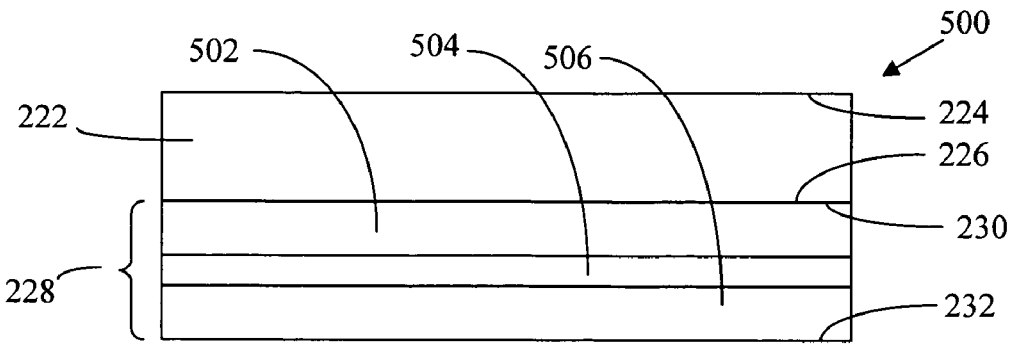
FIGS. 14A to 14F are side cross-sectional views illustrating the steps of a method for fabricating a light emitting diode.

In step 402 of flow diagram 400, a layered semiconductor structure is provided on a growth substrate. FIG. 14A illustrates a side cross-sectional view of assembly 500 that includes a growth substrate 222 and a layered semiconductor structure 228. The growth substrate 222 has a first or top surface 224 and a second or bottom surface 226 opposite the first surface 224. The layered semiconductor structure 228 has a first or top surface 230 and a second or bottom surface 232 opposite the first surface 230. The top surface 230 of the layered semiconductor structure is in contact with the bottom surface 226 of the growth substrate.

The layered semiconductor structure 228 can be fabricated from any semiconductor material or combination of semiconductor materials. Example materials include GaN-based materials such as GaN, AlN, AlGaN, InN, InGaN and AlInGaN as well as other semiconductor materials including AlGaInP, GaAs, AlGaAs, InGaAs, InGaAsP, AlGaInP, InP, SiC, Si, ZnO or diamond. Preferred semiconductor materials are GaN-based material such as GaN, AlN, AlGaN, InN, InGaN and AlInGaN. For assembly 500, the layered semiconductor structure includes a first doped layer 502, an active layer 504 and a second doped layer 506. The layered semiconductor structure is grown epitaxially by any standard growth technique including, but not limited to, chemical vapor deposition (CVD), metal-organic chemical vapor deposition (MOCVD), liquid phase epitaxy (LPE), vapor phase epitaxy (VPE), hydride vapor phase epitaxy (HVPE) or molecular beam epitaxy. As an illustrative example, the layered semiconductor structure is grown by HVPE.

The first doped layer 502 may be an n-doped layer or a p-doped layer. In this illustrative example, the first doped layer is an n-doped layer.

The active layer 504 can be a single layer or contain multiple layers. The active layer can be a p-n homojunction, a p-n heterojunction, a single quantum well or a multiple quantum well of the appropriate semiconductor material for the resulting LED. In this illustrative example, the active layer is a p-n heterojunction.

The second doped layer 506 and the first doped layer 502 have opposite conductivity types. If the first doped layer is an n-doped layer, then the second doped layer is a p-doped layer. Conversely, if the first doped layer is a p-doped layer, then the second doped layer is an n-doped layer. In this illustrative example the second doped layer is a p-doped layer.

The growth substrate 222 can be any optically transparent substrate upon which the layered semiconductor structure 228 can be epitaxially grown. Example growth substrates for GaN-based materials include, but are not limited to, sapphire ($Al_2O_3$), silicon carbide (SiC), bulk GaN and bulk AlN. Sapphire is optically transparent in the 200-700 nm wavelength range and is a preferred substrate for this invention.

In step 404 of flow diagram 400, a pulsed laser beam is provided. FIG. 4 is a schematic diagram of a laser system 240 that can provide a pulsed laser beam 246. Laser system 240 is described in detail in the description for FIG. 4. The laser system 240 includes a pulsed laser 242 and focusing optics 244. The laser beam 246 from pulsed laser 242 can have any cross-sectional shape including, but not limited to, a circle, an oval, a square, a rectangle or a polygon. Preferred shapes are elongated shapes that include ovals and rectangles. Elongated shapes cover more area per pulse resulting in faster scanning times. It is also possible to split a single laser beam into an array of laser beams. The array of laser beams can be a one-dimensional array or a two-dimensional array. As an illustrative example, the shape of the laser beam in FIG. 4 that is used to make the surface features in FIG. 14B is an elongated beam in the shape of an oval.

The pulsed laser 242 used in steps 404 and 406 is any pulsed laser that has a wavelength that passes through the growth substrate with negligible absorption and then is strongly absorbed by the layered semiconductor structure. A preferred laser is a frequency-quadrupled Nd:YAG laser operating at 266 nm. An exemplary pulsed, frequency-quadrupled, Nd:YAG laser is a diode-pumped-solid-state (DPSS) laser. A pulsed, DPSS, Nd:YAG laser operating at 266 nm can have a pulse repetition rate of 200,000 Hertz or higher. Pulse lengths are typically 5-30 nanoseconds.

In step 406 of flow diagram 400, the pulsed laser beam is scanned across the growth substrate in at least a first direction. The pulsed laser beam is transmitted through the growth substrate and absorbed at the first or upper surface of the layered semiconductor structure. The pulsed laser beam decomposes a first portion of the first or upper surface of the layered semiconductor structure, resulting in the formation of an interfacial layer of non-uniform thickness between the first or upper surface of the layered semiconductor structure and the second or bottom surface of the growth substrate. Simultaneously, the pulsed laser beam forms surface features on the first or upper surface of the layered semiconductor structure. The surface features are light extracting elements for the LED. By forming an interfacial layer for subsequent growth substrate remove and by simultaneously forming surface features in one step, the number of steps required to fabricate LEDs is reduced.

Figure 14B:
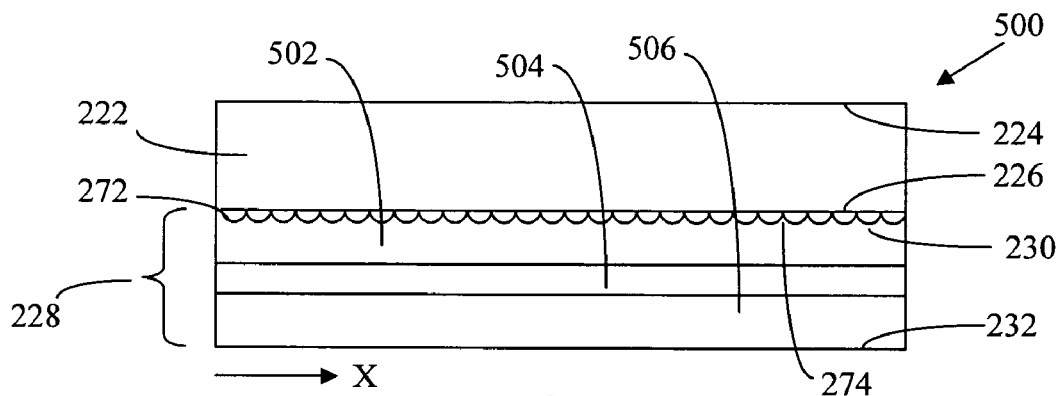

FIG. 14B illustrates step 406. FIG. 14B is a side cross-sectional view of assembly 500 following a laser scan in a first direction. The first direction can be, for example, the X-direction (plus or minus) or the Y-direction (plus or minus). In FIG. 14B, the scan direction is the X-direction (plus or minus). Referring to FIGS. 4 and 14B, the laser scanning can be done either by scanning the laser beam 246 in the plus X or minus X direction and leaving assembly 500 stationary or by scanning assembly 500 in the minus X or plus X direction and leaving the laser beam 246 stationary.

FIGS. 13 and 14 illustrate a method where the laser scan is in the X direction across assembly 500. It is within the scope of this invention that the laser may be scanned in both a first direction and in a second direction, where the second direction is at an angle to the first direction. For example, the laser may be scanned in both the X direction to form a first portion of the surface features and in the Y direction to form a second portion of the surface features.

When the laser beam 246 that was illustrated in FIG. 4 is absorbed by the layered semiconductor structure 228 at surface 230 in FIG. 14B, the surface 230 is decomposed and an interfacial layer 272 of non-uniform thickness is formed. At the same time as the interfacial layer is formed, the laser pulses simultaneously form surface features 274 on the upper surface 230 of the layered semiconductor structure. The surface features are formed in the regions between the centers of the laser pulses. The centers of the surface features are located at the edges of the oval patterns formed by the laser pulses. In FIG. 14B, the oval patterns in the interfacial layer are seen in cross-section. If the surface of the layered semiconductor structure is GaN, for example, the laser will decompose the GaN into gallium metal and nitrogen gas and form an interfacial layer of non-uniform thickness that is primarily gallium metal. Successive laser pulses form a series of oval patterns as the laser beam is scanned across the layered semiconductor structure. The oval patterns overlap resulting in a continuous interfacial layer of non-uniform thickness that covers the entire surface area that has been scanned.

FIG. 14B illustrates the thickness variation of the interfacial layer 272 and the profile of the surface features 274 that are formed on the upper surface 230 of the layered semiconductor structure 228. The thickness of the interfacial layer 272 varies depending on the intensity of the laser beam at each point on the scanned surface 230. At the center of a laser pulse where the laser beam has the highest intensity, the interfacial layer 272 will be thicker than at the edges of the laser pulse.

The surface features 274 on surface 230 have shapes that depend on the intensity profile of the laser beam. In FIGS. 14B to 14H, the surface features on surface 230 have curved sidewalls and pointed tips. However, the surface features may alternatively have planar sidewalls and the tips may be rounded rather than pointed. The surface features 274 are light extraction elements for the LED that results from the fabrication method described by flow diagram 400.

Figure 14C:
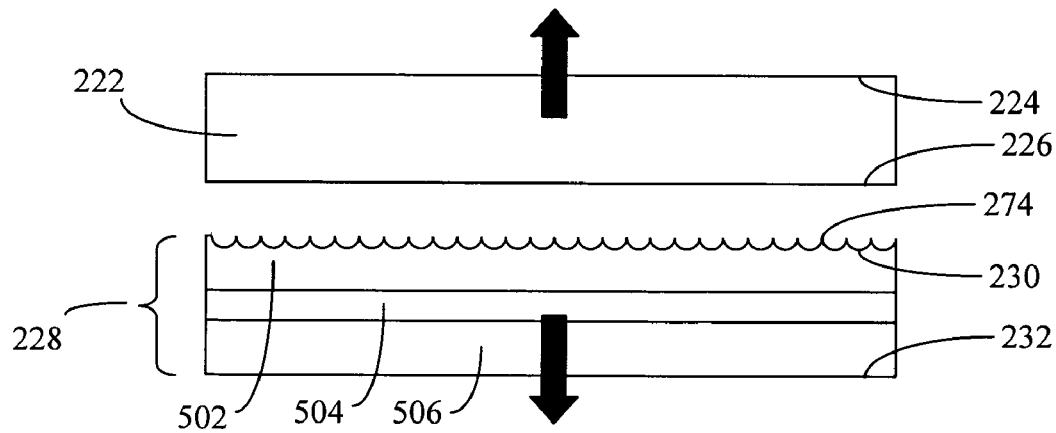
Figure 14D:
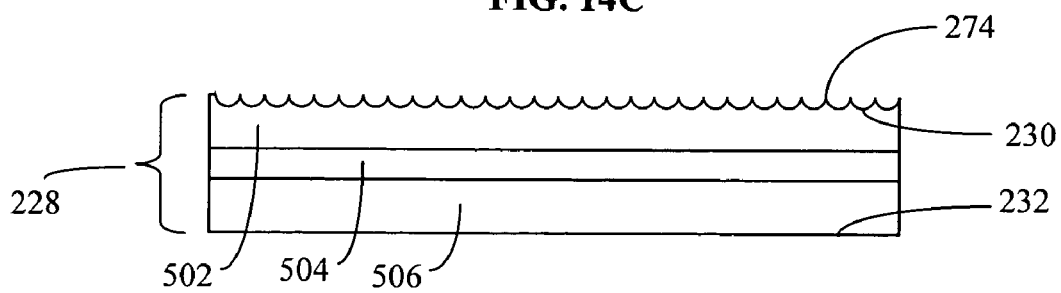

In step 408 of flow diagram 400, the layered semiconductor structure is detached from the growth substrate by severing the interfacial layer. FIG. 14C illustrates step 408. If the layered semiconductor structure is GaN, the interfacial layer will consist of gallium metal and any nitrogen gas that is trapped in the interfacial layer. Gallium metal has a melting point of approximately 30 degrees Celsius. To detach the layered semiconductor structure from the growth substrate, the assembly 500 can be heated to a temperature above 30 degrees Celsius to melt the gallium and allow for easy separation. FIG. 14D illustrates the layered semiconductor structure 228 after detachment from the growth substrate.

After the layered semiconductor structure is detached from the growth substrate, the first surface 230 of the layered semiconductor structure is preferably cleaned. This step is not shown in the diagrams of FIG. 14. Any gallium metal that remains on the layered semiconductor structure after the detachment step is removed by the cleaning step. For example, gallium metal residue can be removed using a 50:50 volumetric mixture of hydrogen chloride (HCl) and water. The cleaning step is necessary to fully expose surface features 274 and to prepare surface 230 for any additional processing steps.

Figure 14E:
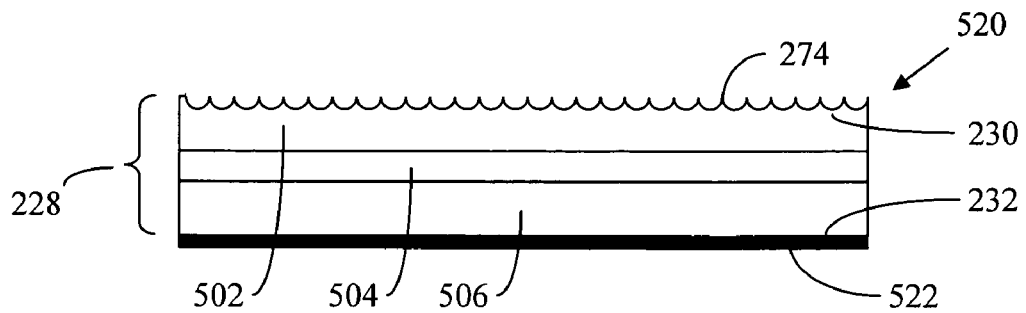

In step 410 of flow diagram 400, a first electrode is fabricated on the second or bottom surface 232 of the layered semiconductor structure. The resulting assembly 520 is illustrated in FIG. 14E. The first electrode 522 is fabricated on the second surface 232 of the layered semiconductor structure 228. Step 410 is illustrated to occur after step 408, but the step of fabricating a first electrode may be done at other points in the overall fabrication method, such as after step 402 or after step 406.

At this point the resulting layered semiconductor structure can emit light from all surfaces of the structure if a means is used to inject current into the structure efficiently. The use of transparent conductive layers including but not limited to ZnO, ITO, IZO, AZO, and subwavelength conductive materials such as carbon nanotubes to enhance current injection into either or both sides of the structure is an embodiment of this invention. By combining these highly transmissive conductive layers with the low absorption characteristics of the HVPE grown semiconductor structures, light emitting diodes with integrated transmissivity greater than 50% can be realized. More preferably integrated transmissivity greater than 70%. The use of these light emitting diodes in embedded, spherical, or bidirectional sources are also embodiments of this invention. In this manner, high extraction efficiency due to reduced light trapping within the layered semiconducting structure due to it's geometry and reduced absorption within the layers themselves as well as extraction elements created during the separation process can be realized in a minimum number of process steps. The use of this type of light emitting diode in embedded applications in which thermally conductive luminescent elements are used to surround at least a portion of the light emitting diode for thermal extraction is an embodiment of this invention.

Preferably the first electrode 522 covers the entire second or bottom surface 232 of the layered semiconductor structure, but complete coverage is not required. The first electrode 522 may be fabricated from a reflecting metal. For example, the first electrode may be formed from one or more metals or metal alloys containing, for example, silver or aluminum. As a further example, the first electrode may include a dielectric layer between the bottom surface 232 of the layered semiconductor structure and the metal layer in order to form an omnidirectional reflector. Any standard fabrication technique may be used to deposit the first electrode 522, such as thermal evaporation, electron beam evaporation or sputtering.

Figure 14F:
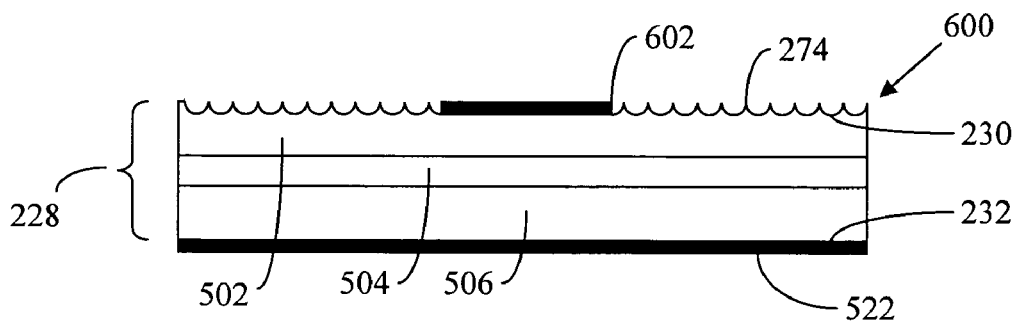

In step 412 of flow diagram 400, a second electrode 602 is fabricated on a portion of the first surface 230 of the layered semiconductor structure. A side cross-sectional view of the resulting LED 600 is illustrated in FIG. 14F. The remainder of the first surface 230 is left uncovered to allow light to escape from the resulting LED. The second electrode 602 can be fabricated from any conducting metal or metal alloy that is compatible with the semiconductor material used for the second doped layer. Example materials include gold, gold alloys such as titanium-gold, aluminum and silver.

Figure 14G:
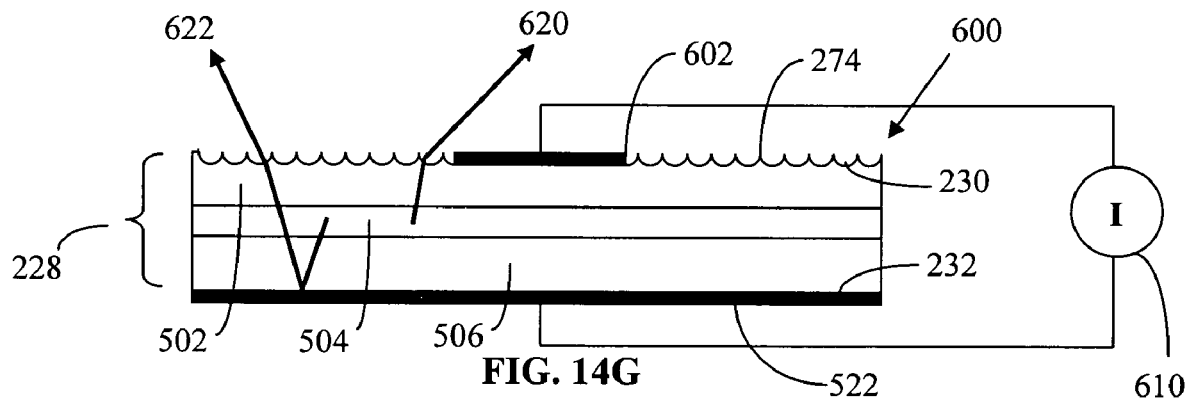
FIGS. 14G to 14H are side cross-sectional views of the resulting light emitting diode and illustrate example light rays.

Referring to FIG. 14G, applying an electrical current from current source 610 between the first electrode 522 and the second electrode 602 causes the active layer 504 of LED 600 to emit internally generated light. The surface features 274 reduce total internal reflection from surface 230 and thereby improve light extraction of internally generated light from surface 230 of LED 600.

Specialized LED applications utilizing light recycling require that LEDs have high reflectivity to externally incident light in addition to being efficient emitters of internally generated light. In light recycling applications, some of the internally generated light emitted by the LEDs is recycled back to the LEDs as externally incident light. In such applications, it is desirable that a high percentage of the externally incident light be reflected by the LEDs and not absorbed by the LED structure. The reflectivity of LED 600 to externally incident light depends on several factors. These factors include the absorption coefficient of the LED semiconductor materials, the reflectivity of the first electrode 522 and the reflectivity of the second electrode 602. Much of the light externally incident on LED 600 is transmitted at least two times through the first doped layer 502, the active layer 504 and the second doped layer 506. The first electrode 522 reflects the externally incident light that passes through the semiconductor layers. By lowering the absorption coefficient of the semiconductor materials, the reflectivity of LED 600 to externally incident light will increase. Furthermore, increasing the reflectivity of the first electrode 522 and/or the second electrode 602 will increase reflectivity of LED 600 to externally incident light.

In order to improve the reflectivity of LED 600 to externally incident light, preferably the average absorption coefficient (i.e. the thickness-weighted average absorption coefficient) of the first doped layer 502, the active layer 504, and the second doped layer 506 in the emitting wavelength range of the internally generated light is less than 50 $cm^{-1}$. More preferably, the average absorption coefficient of the semiconductor layers in the emitting wavelength range is less than 25 $cm^{-1}$. Most preferably, the average absorption coefficient of the semiconductor layers in the emitting wavelength range is less than 10 $cm^{-1}$. In prior art GaN-based LEDs, the absorption coefficient of the semiconductor layers in the emitting wavelength range of the internally generated light is generally greater than 50 $cm^{-1}$. In order to minimize the absorption coefficient of the semiconductor layers, the absorption coefficient of each layer must be minimized. This can be accomplished by improving the deposition processes for the different layers in order to reduce impurities or defects and to improve the crystalline structure of the layers. For example, hydride vapor phase epitaxy (HVPE) can be used to epitaxially grow the first doped layer or the entire semiconductor structure. HVPE does not have the carbon impurities that can be present in the metal-organic chemical vapor deposition (MOCVD) processes normally used in GaN LED fabrication. Alternatively, if MOCVD is used to deposit the layers, a higher deposition temperature can be used to reduce carbon impurities and crystalline defects in the layers. If the active layer 504 of LED 600 is a p-n heterojunction, preferably all the semiconductor layers of LED 600 are fabricated by HVPE.

A common electrode material for the second electrode 602 in prior art light emitting devices is gold. Gold has very good electrical properties, but is a poor optical reflector for visible light in the range of 400 nm to 550 nm. For LEDs that emit light in the 400-550 nm range or thereabouts, it is advantageous to replace gold with a more reflective material. In order to improve the reflectivity of LED 600 to externally incident light, preferably the second electrode 602 has a reflectivity greater than 60 percent in the emitting wavelength range. More preferably, the second electrode 602 has a reflectivity greater than 80 percent in the emitting wavelength range. Preferred materials for the second electrode that have a reflectivity greater than 80 percent include aluminum and silver.

The first electrode 522 covers a larger surface area than the second electrode 602. Consequently, the reflectivity of the first electrode is more critical than the reflectivity of the second electrode. In order to improve the reflectivity of LED 600 to externally incident light, preferably the reflectivity of the first electrode 522 is greater than 85 percent in the emitting wavelength range. More preferably the reflectivity of the first electrode is greater than 90 percent in the emitting wavelength range. Most preferably, the reflectivity of the first electrode is greater than 95 percent in the emitting wavelength range. Preferred materials for the first electrode that have a reflectivity greater than 95 percent include silver and omni-directional reflectors that include a quarter-wave thick dielectric layer such as silicon diode between the electrode metal and the layered semiconductor structure.

By lowering the absorption coefficient of the semiconductor materials, and increasing the reflectivity of the first electrode and the second electrode, preferably the average reflectivity of LED 600 to externally incident light is greater than 50%. More preferably, the average reflectivity of LED 600 to externally incident light is greater than 60%. Most preferably, the average reflectivity of LED 600 to externally incident light is greater than 70%. The average reflectivity of LED 600 is defined as the area-weighted average reflectivity of the second electrode 602 and the portions of the output surface 230 of LED 600 that are not covered by the second electrode.

Figure 14H:
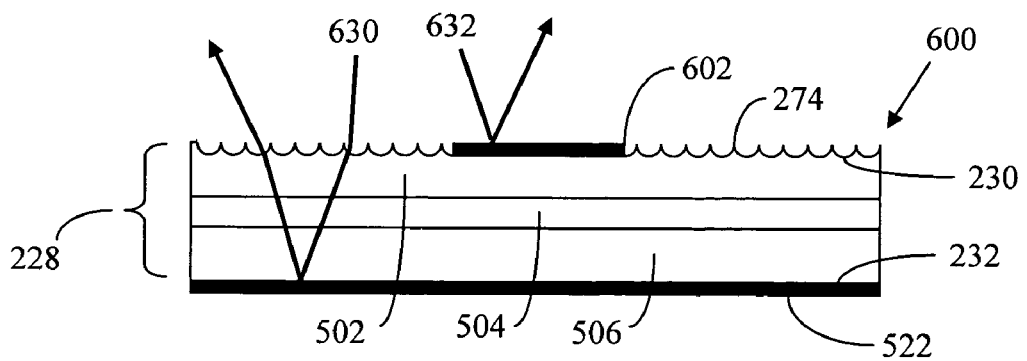

Example internally generated light rays 620 and 622 in FIG. 14G and externally incident light rays 630 and 632 in FIG. 14H illustrate the function of LED 600.

In FIG. 14G, the active layer 504 emits internally generated light ray 620. Internally generated light ray 620 passes through the interior of active layer 504 and passes through the first doped layer 502 to surface 230. Internally generated light ray 620 is extracted from LED 600 by surface features 274 on the first surface 230 and exits LED 600. The surface features 274 are light extraction elements for LED 600.

In FIG. 14G, the active layer 504 emits internally generated light ray 622. Internally generated light ray 622 passes through the interior of active layer 504, passes through the second doped layer 506 and is reflected by first electrode 522. Internally generated light ray 622 passes through the second doped layer 506 a second time, passes through the active layer 504 and passes through the first doped layer 502 to first surface 230. Internally generated light ray 622 is extracted from LED 600 by surface features 274 on the first surface 230 and exits LED 600. The surface features 274 are light extraction elements for LED 600.

In FIG. 14H, externally incident light ray 630 is incident upon first surface 230 of LED 600. Externally incident light ray 630 passes through surface 230, passes through the first doped layer 502, passes through the active layer 504, passes through the second doped layer 506 and is reflected by first electrode 522. Externally incident light ray 630 passes through the second doped layer 506 a second time, passes through the active layer 504 a second time and passes through the first doped layer 502 a second time to reach surface 230. Externally incident light ray 630 is extracted from LED 600 by surface features 274 on the first surface 230 and exits LED 600. By this process, LED 600 reflects externally incident light ray 630.

In FIG. 14H, externally incident light ray 632 is incident upon second electrode 602 of LED 600. Externally incident light ray 632 is reflected by second electrode 602. By this process, LED 600 reflects externally incident light ray 632.

While the invention has been described in conjunction with specific embodiments and examples, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A method for separating a layered semiconductor structure from an optically transparent growth substrate and simultaneously forming surface features on said layered semiconductor structure, said method comprising the steps of:
providing said layered semiconductor structure fabricated on said growth substrate, wherein said growth substrate has a first surface and a second surface opposite said first surface and wherein said layered semiconductor structure has a first surface in contact with said second surface of said growth substrate and a second surface opposite said first surface;
providing a pulsed laser beam;
scanning said pulsed laser beam across said first surface of said growth substrate in at least a first direction, wherein said pulsed laser beam is transmitted through said growth substrate to said first surface of said layered semiconductor structure and wherein said pulsed laser beam decomposes said first surface of said layered semiconductor structure, resulting in the formation of an interfacial layer of non-uniform thickness between said first surface of said layered semiconductor structure and said second surface of said growth substrate and the simultaneous formation of said surface features on said first surface of said layered semiconductor structure; and
detaching said layered semiconductor structure from said growth substrate by severing said interfacial layer.

2. A method as in claim 1, wherein said scanning step includes the steps of:
scanning said pulsed laser beam across said first surface of said growth substrate in a first direction, wherein said pulsed laser beam is transmitted through said growth substrate to said first surface of said layered semiconductor structure and wherein said pulsed laser beam decomposes a first portion of said first surface of said layered semiconductor structure, resulting in the formation of a first portion of an interfacial layer of non-uniform thickness between said first surface of said layered semiconductor structure and said second surface of said growth substrate and the simultaneous formation of a first portion of said surface features on said first surface of said layered semiconductor structure; and
scanning said pulsed laser beam across said first surface of said growth substrate in a second direction, wherein said pulsed laser beam is transmitted through said growth substrate to said first surface of said layered semiconductor structure and wherein said pulsed laser beam decomposes a second portion of said first surface of said layered semiconductor structure, resulting in the formation of a second portion of an interfacial layer of non-uniform thickness between said first surface of said layered semiconductor structure and said second surface of said growth substrate and the simultaneous formation of a second portion of said surface features on said first surface of said layered semiconductor structure.

3. A method as in claim 2, wherein said pulsed laser beam has an elongated shape, wherein said first portion and said second portion of said interfacial layer cover substantially all of said first surface of said layered semiconductor structure and wherein said second direction is at an angle to said first direction.

4. A method as in claim 2, wherein said angle is between 85 degrees and 95 degrees.

5. A method as in claim 4, wherein said surface features have four sides.

6. A method as in claim 1, wherein said layered semiconductor structure includes a first doped layer, an active layer and a second doped layer, said method further comprising the steps of:
fabricating a first electrode on said second surface of said layered semiconductor structure; and
fabricating a second electrode on a portion of said first surface of said semiconductor layer;
wherein the resulting assembly is a light emitting diode, wherein applying an electrical current between said first electrode and said second electrode causes said active layer to emit internally generated light and wherein said surface features improve the light extraction efficiency of said internally generated light from said layered semiconductor structure.

7. A method as in claim 2, wherein said layered semiconductor structure is grown by hydride vapor phase epitaxy.

8. A method as in claim 6, wherein said light emitting diode preferably reflects greater than 50 percent of externally incident light.

9. A method as in claim 8, wherein said light emitting diode preferably reflects greater than 60 percent of said externally incident light.

10. A method as in claim 9, wherein said light emitting diode preferably reflects greater than 70 percent of said externally incident light.

11. A method as in claim 1, wherein said growth substrate is sapphire.

12. A method as in claim 1, wherein said pulsed laser is a frequency-quadrupled Nd:YAG laser.

* * * * *